(12) United States Patent
Strano et al.

(10) Patent No.: US 11,296,271 B2
(45) Date of Patent: Apr. 5, 2022

(54) MATERIALS, DEVICES, AND METHODS FOR RESONANT AMBIENT THERMAL ENERGY HARVESTING

(71) Applicant: Massachusetts Institute of Technology, Cambridge, MA (US)

(72) Inventors: Michael S. Strano, Lexington, MA (US); Anton Lee Cottrill, Cambridge, MA (US); Sayalee Girish Mahajan, Cambridge, MA (US); Tianxiang Liu, Cambridge, MA (US); Volodymyr B. Koman, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 489 days.

(21) Appl. No.: 16/120,114

(22) Filed: Aug. 31, 2018

(65) Prior Publication Data
US 2019/0063412 A1    Feb. 28, 2019

Related U.S. Application Data

(60) Provisional application No. 62/552,497, filed on Aug. 31, 2017.

(51) Int. Cl.
*H01L 35/30* (2006.01)
*H01L 35/02* (2006.01)
(Continued)

(52) U.S. Cl.
CPC .............. *H01L 35/30* (2013.01); *H01L 35/02* (2013.01); *H01L 35/32* (2013.01); *F03G 7/04* (2013.01);
(Continued)

(58) Field of Classification Search
CPC ......... H01L 35/02; H01L 35/30; H01L 35/32; F03G 7/06
See application file for complete search history.

(56) References Cited

U.S. PATENT DOCUMENTS

| 4,086,769 A | 5/1978 | Smith |
| 2005/0172993 A1 | 8/2005 | Shimoji et al. |

(Continued)

FOREIGN PATENT DOCUMENTS

| EP | 1840980 A1 | 10/2007 |
| WO | 2009/111008 A1 | 9/2009 |
| WO | 2014/110226 A1 | 7/2014 |

OTHER PUBLICATIONS

Liang et al. "Graphene—nickel/n-carboxylic acids composites as form-stable phase change materials for thermal energy storage". Solar Energy Materials & Solar Cells 132 (2015) 425-430. (Year: 2015).*

(Continued)

*Primary Examiner* — Lindsey A Bernier
(74) *Attorney, Agent, or Firm* — Barnes & Thornburg LLP

(57) ABSTRACT

The present disclosure is directed to materials, devices, and methods for resonant ambient thermal energy harvesting. Thermal energy can be harvested using thermoelectric resonators that capture and store ambient thermal fluctuations and convert the fluctuations to energy. The thermal resonators can include heat engines disposed between masses of varying sizes or diodes. The masses or diodes can be made of high and ultra-high effusivity materials to transfer thermal energy through the resonator and optimize power output. The masses or diodes of the resonator can be tuned to the dominant frequency of the temperature waveform to maximize the amount of energy being converted. The resonators can be added to existing structures to supply or generate (Continued)

power, and, in some embodiments, the structures themselves can be a mass of the thermal resonator. Methods for constructing and/or using such devices are also provided, as are methods for formulating ultra-high effusivity materials.

13 Claims, 5 Drawing Sheets

(51) Int. Cl.
  H01L 35/32    (2006.01)
  F03G 7/06     (2006.01)
  H02N 11/00    (2006.01)
  F03G 7/04     (2006.01)
  H02S 40/44    (2014.01)
(52) U.S. Cl.
  CPC .............. F03G 7/06 (2013.01); H02N 11/002 (2013.01); H02S 40/44 (2014.12)

(56) References Cited

U.S. PATENT DOCUMENTS

| 2006/0118157 | A1* | 6/2006 | Johnson | B82Y 10/00 136/205 |
| 2011/0120116 | A1 | 5/2011 | Alexander et al. | |
| 2015/0083180 | A1* | 3/2015 | Lang | H01L 35/30 136/207 |

OTHER PUBLICATIONS

Xia et al. "Synthesis of three-dimensional graphene aerogel encapsulated n-octadecane for enhancing phase change behavior and thermal conductivity". J. Mater. Chem. A, 2017, 5, 15191. (Year: 2017).*
Wang, S et al., "Microscale solid-state thermal diodes enabling ambient temperature thermal circuits for energy applications," Physical Chemistry Chemical Physics, vol. 19, Issue 20, pp. 13172-13181, May 10, 2017.
Westwood, M, "Master's thesis, Thermal Rectification to Increase Power and Efficiency of Solar-Thermal Electricity Generation," University of California at Berkeley, 2015 (22 pages).
Whalen et al., "Thermoelectric energy harvesting from diurnal heat flow in the upper soil layer," Energy Conversion and Management, vol. 64, pp. 397-402, Dec. 2012 (6 pages).
Wu et al., "Thermal rectification in carbon nanotube intramolecular junctions: Molecular dynamics calculations," Physics Review B, vol. 76, Article No. 085424, Aug. 2007 (8 pages).
Xia et al., "Preparation and thermal characterization of expanded graphite/paraffin composite phase change material," Carbon, vol. 48, Issue 9, pp. 2538-2548, Aug. 2010 (11 pages).
Xiao et al., "Effective thermal conductivity of open-cell metal foams impregnated with pure paraffin for latent heat storage," International Journal of Thermal Sciences, vol. 81, pp. 94-105, Jul. 2014 (12 pages).
Xiao et al., "Preparation and thermal characterization of paraffin/metal foam composite phase change material," Applied Energy, vol. 112, pp. 1357-1366, Dec. 2013 (10 pages).
Yang et al., "Carbon nanocone: A promising thermal rectifier," Applied Physics Letters, vol. 93, Article No. 243111, 2008 (4 pages).
Yang et al., "Preparation and properties of myristic-palmitic-stearic acid/expanded graphite composites as phase change materials for energy storage," Solar Energy, vol. 99, pp. 259-266, Jan. 2014 (8 pages).
Yang et al., "Thermal rectification in asymmetric graphene ribbons," Applied Physics Letters, vol. 95, Article No. 033107, 2009 (4 pages).

Ye et al., "Thermal rectification at the bimaterial nanocontact interface," Nanoscale, vol. 9, Issue 32, pp. 11480-11487, 2017 (8 pages).
Yildiz, F, "Potential Ambient Energy-Harvesting Sources and Techniques," Journal of Technology Studies, vol. 35, Issue 1, pp. 40-48, 2009 (9 pages).
Zalba et al., "Review on thermal energy storage with phase change: materials, heat transfer analysis and applications," Applied Thermal Engineering, vol. 23, Issue 3, pp. 251-283, Feb. 2003 (33 pages).
Zarr et al., "Standard Reference Materials: SRM 1453, Expanded Polystyrene Board, for Thermal Conductivity from 281 K to 313 K," NIST Special Publication, vol. 260, Issue 175, 2012 (65 pages).
Zhang et al., "A capric-palmitic-stearic acid ternary eutectic mixture/expanded graphite composite phase change material for thermal energy storage," Composites Part A: Applied Science and Manufacturing, vol. 87, pp. 138-145, Aug. 2016 (8 pages).
Zhang et al., "A review of the composite phase change materials: Fabrication, characterization, mathematical modeling and application to performance enhancement," Applied Energy, vol. 165, pp. 472-510, Mar. 2016 (39 pages).
Zhang et al., "Concentrated solar power plants: Review and design methology," Renewable and Sustainable Energy Reviews, vol. 22, pp. 466-481, Jun. 2013 (16 pages).
Zhang et al., "Giant Thermal Rectification from Polyethylene Nanofiber Thermal Diodes," Small, vol. 11, Issue 36, pp. 4657-4665, 2015 (9 pages).
Zhao, X, "Master's thesis, Thermal Diode Bridge Applied to Solar Energy Harvesting," University of California at Berkeley, 2015 (18 pages).
Zhou et al., "Vapor Chamber with Thermal Diode and Switch Functions," 2017 16th IEEE Intersociety Conference on Thermal and Thermomechanical Phenomena in Electronic Systems (ITHERM), pp. 521-528, 2017 (8 pages).
Zhu et al., "Temperature-Gated Thermal Rectifier for Active Heat Flow Control," Nano Letters, vol. 14, Issue 8, pp. 4867-4872, Jul. 2014 (6 pages).
Cartoixa et al., "Thermal Rectification by Design in Telescopic Si Nanowires," Nano Letters, vol. 15, Issue 12, pp. 8255-8259, Nov. 23, 2015 (5 pages).
Nakayama et al., "Thermal Rectification in Bulk Material Through Unusual Behavior of Electron Thermal Conductivity of Al—Cu—Fe Icosahedral Quasicrystal," Journal of Electronic Materials, vol. 44, Issue 1, pp. 356-361, Jan. 2015 (6 pages).
Narayana et al., "Heat Flux Manipulation with Engineered Thermal Materials," Physical Review Letters, vol. 108, Article No. 214303, May 2012 (5 pages).
Nguyen et al., "Pyroelectric energy converter using co-polymer P(VDF-TrFE) and Olsen cycle for waste heat energy harvesting," Applied Thermal Engineering, vol. 30, Issue 14-15, pp. 2127-2137, Oct. 2010 (11 pages).
Ni et al., "Thermal conductivity and thermal rectification in unzipped carbon nanotubes," Journal of Physics Condensed Matter, vol. 23, Article No. 215301, May 2011 (7 pages).
Ong et al., "Heat spreading and heat transfer coefficient with fin heat sink," Applied Thermal Engineering, vol. 112, pp. 1638-1647, Feb. 2017 (10 pages).
Paradiso et al., "Energy scavenging for mobile and wireless electronics," IEEE Pervasive Computing, vol. 4, pp. 18-27, 2005 (10 pages).
Peace et al., "Structure of high-internal-phase-ratio emulsions," Journal of Colloid and Interface Science, vol. 47, No. 2, pp. 416-423, May 1974 (8 pages).
Peyrard, M, "The design of a thermal rectifier," Europhysics Letters, vol. 76, No. 1, pp. 49-55, Aug. 2006 (8 pages).
Potnuru et al., "Characterization of pyroelectric materials for energy harvesting from human body," Intergrated Ferroelectrics, vol. 150, pp. 1-28, 2014 (29 pages).
Quoilin et al., "Performance and design optimization of a low-cost solar organic Rankine cycle for remote power generation," Solar Energy, vol. 85, Issue 5, pp. 955-966, May 2011 (12 pages).
Reuse et al., "Hydrogen production for fuel cell application in an autothermal micro-channel reactor," Chemical Engineering Journal, vol. 101, Issues 1-3, pp. 133-141, Aug. 2004 (9 pages).

(56) References Cited

OTHER PUBLICATIONS

Richardson et al., "An analysis of phase change material as thermal mass," Proceedings of the Royal Society London A Mathematical Physical and Engineering Sciences, vol. 464, pp. 1029-1056, 2008 (28 pages).
Roberts et al., "A review of thermal rectification observations and models in solid materials," International Journal of Thermal Sciences, vol. 50, Issue 5, pp. 648-662, May 2011 (15 pages).
Royne et al., "Cooling of photovoltaic cells under concentrated illumination: a critical review," Solar Energy Materials and Solar Cells, vol. 86, Issue 4, pp. 451-483, Apr. 2005 (33 pages).
Samson et al., "Flight test results of a thermoelectric energy harvester for aircraft," Journal of Electronic Materials, vol. 41, Issue 6, pp. 1134-1137, Jun. 2012 (4 pages).
Sari et al., "Microencapsulated n-octacosane as phase change material for thermal energy storage," Solar Energy, vol. 83, Issue 10, pp. 1757-1763, Oct. 2009 (7 pages).
Sarler, B, "Stefan's work on solid-liquid phase changes," Engineering Analysis with Boundary Elements, vol. 16, Issue 2, pp. 83-92, 1995 (10 pages).
Sawaki et al., "Thermal rectification in bulk materials with asymmetric shape," Applied Physics Letters, vol. 98, Article No. 081915, 2011 (4 pages).
Sebald et al., "Energy harvesting based on Ericsson pyroelectric cycles in a relaxor ferroelectric ceramic," Smart Materials and Structures, vol. 17, Article No. 015012, 2007 (7 pages).
Sebald et al., "On thermoelectric and pyroelectric energy harvesting," Smart Materials and Structures, vol. 18, Article No. 125006, Sep. 2009 (8 pages).
Sharaf et al., "Concentrated photovoltaic thermal (CPVT) solar collector systems: Part I—Fundamentals, design considerations and current technologies," Renewable and Sustainable Energy Reviews, vol. 50, pp. 1500-1565, Oct. 2015 (66 pages).
Shen et al., "A Dual-Port Triple-Band L-Probe Microstrip Patch Rectenna for Ambient RF Energy Harvesting," IEEE Antenna and Wireless Propagation Letters, vol. 16, pp. 3071-3074, 2017 (4 pages).
Shih et al., "Maximal rectification ratios for idealized bi-segment thermal rectifiers," Scientific Reports, vol. 5, Article. No. 12677, Aug. 2015 (11 pages).
Singh, G. K., "Solar power generation by PV (photovoltaic) technology: A review," Energy, vol. 53, pp. 1-13, 2013 (13 pages).
Sorour et al., "Thermal conductivity and diffusivity of soil," International Communications in Heat and Mass Transfer, vol. 17, Issue 2, pp. 189-199, 1990 (11 pages).
Starr, C, "The copper oxide rectifier," Physics, vol. 7, pp. 15-19, 1936 (6 pages).
Stevens, J.W., "Optimal placement depth for air-ground heat transfer systems," Applied Thermal Engineering, vol. 24, Issues 2-3, pp. 149-157, Feb. 2004 (9 pages).
Stevens, J.W., "Performance factors for ground-air thermoelectric power generators," Energy Conversion and Management, vol. 68, pp. 114-123, Apr. 2013 (10 pages).
Takeuchi et al., "Development of a Thermal Rectifier Usable at High Temperature," Journal of Electronic Materials, vol. 40, No. 5, pp. 1129-1135, May 2011 (8 pages).
Takeuchi et al., "Improvement in rectification ratio of an Al-based bulk thermal rectifier working at high temperatures," Journal of Applied Physics, vol. 111, Article No. 093517, 2012 (8 pages).
Takeuchi, T, "Very large thermal rectification in bulk composites consisting partly of icosahedral quasicrystals," Science and Technology of Advanced Materials, vol. 15, Article No. 064801, Nov. 2014 (9 pages).
Terraneo et al., "Controlling the Energy Flow in Nonlinear Lattices: A Model for a Thermal Rectifier," Physical Review Letters, vol. 88, No. 9, Mar. 2002 (4 pages).
Tian et al., "A Novel Solid-State Thermal Rectifier Based on Reduced Graphene Oxide," Scientific Reports, vol. 2, Article No. 523, Jul. 23, 2012 (7 pages).
Tillman et al., "Meterology Data—Direct from Mars!" from: https://www-k12.atmos.washington.edu/k12/resources/mars_data-information/data.html.
Tso et al., "Solid-state thermal diode with shape memory alloys," International Journal of Heat and Mass Transfer, vol. 93, pp. 605-611, Feb. 2016 (7 pages).
Tsukamoto et al., "Micro thermal diode with glass thermal insulation structure embedded in a vapor chamber," Journal of Physics: Conference Series, vol. 476, 2013 (6 pages).
Tu et al., "Controllable growth of 1-7 layers of graphene by chemical vapour deposition," Carbon, vol. 73, pp. 252-258, Jul. 2014 (7 pages).
Vega, L.A., "Ocean thermal energy conversion," Encyclopedia of Sustainability Science and Technology, pp. 7296-7328, 2012 (33 pages).
Vorobiev et al., "Thermal-photovoltaic solar hybrid system for efficient solar energy conversion," Solar Energy, vol. 80, Issue 2, pp. 170-176, Feb. 2006 (7 pages).
Vélez et al., "Temperature-dependent thermal properties of solid/liquid phase change even-number3ed n-alkines: n-Hexadecane, n-octadecane and n-eicosane," Applied Energy, vol. 143, pp. 383-394, Apr. 2015 (12 pages).
Wang et al., "A simple method for the estimation of thermal inertia," Geophysical Research Letters, vol. 37, No. L05404, Mar. 2010 (5 pages).
Wang et al., "Experimental study of thermal rectification in suspended monolayer graphene," Nature Communications, vol. 8, Article No. 15843, Jun. 2017 (8 pages).
Wang et al., "Performance evaluation of a low-temperature solar Rankine cycle system utilizing R245fa," Solar Energy, vol. 84, Issue 3, pp. 353-364, 2009 (12 pages).
Wang et al., "Phonon Lateral Confinement Enables Thermal Rectification in Asymmetric Single-Material Nanostructures," Nano Letters, vol. 14, Issue 2, pp. 592-596, Jan. 2014 (5 pages).
Wang et al., "Thermal logic gates: Computation with phonons," Physical Review Letters, vol. 99, Article No. 177208, Oct. 2007 (4 pages).
Wang et al., "Thermal Memory: A Storage of Phononic Information," Physical Review Letters, vol. 101, Article No. 267203, Dec. 29, 2008 (4 pages).
Wang, Z.L., "Triboelectric Nanogenerators as New Energy Technology for Self-Powered Systems and as Active Mechanical and Chemical Sensors," ACS Nano, vol. 7, No. 11, pp. 9533-9557, Sep. 2013 (25 pages).
Wang, Z.L., "Triboelectric Nanogenerators," Springer International Publishing Switzerland, 2016 (537 pages).
Warburg, E, "Ueber das Verhalten sogenannter unpolarisirbarer Elektroden gegn Wechselstrom," annalen der physik, vol. 67, Issue 3, pp. 493-499, 1899 (7 pages).
Wehmeyer et al., "Thermal diodes, regulators, and switches: Physical mechanisms and potential applications," Applied Physics Reviews, vol. 4, Article No. 041304, 2017 (33pages).
Kislitsyn et al., "Thermal Rectifier Based on pn Junction," IEEE Transactions on Electron Devices, vol. 61, No. 2, pp. 548-551, Feb. 2014 (4 pages).
Agbossou et al., "Solar micro-energy harvesting based on thermoelectric and latent heat effects. Part I: theoretical analysis," Sensors and Actuators A: Physical, vol. 163, Issue 1, pp. 277-283, Sep. 2010 (7 pages).
Agyenim et al., "A review of materials, heat transfer and phase change problem formulation for latent heat thermal energy storage systems (LHTESS)," Renewable and Sustainable Energy Reviews, vol. 14, Issue 2, pp. 615-628, Feb. 2010 (14 pages).
Akhtar et al., "Energy replenishment using renewable and traditional energy resources for sustainable wireless sensor networks: A review," Renewable and Sustainable Energy Reviews, vol. 45, pp. 769-784, May 2015 (16 pages).
Akyildiz et al., "Underwater acoustic sensor networks: research challenges," Ad Hoc Networks, vol. 3, Issue 3, pp. 257-279, May 2005 (23 pages).

(56) References Cited

OTHER PUBLICATIONS

Alaghemandi et al., "The thermal conductivity and thermal rectification of carbon nanotubes studied using reverse non-equilibrium molecular dynamics simulations," Nanotechnology, vol. 20, Article No. 115704, 2009 (9 pages).
Alaghemandi et al., "Thermal rectification in mass-graded nanotubes: a model approach in the framework of reverse non-equilibrium molecular dynamics simulations," Nanotechnology, vol. 21, Article No. 075704, Jan. 18, 2010 (7 pages).
Alaghemandi et al., "Thermal rectification in nanosized model systems: A molecular dynamics approach," Physical Review B, vol. 81, Article No. 125410, Mar. 5, 2010 (12 pages).
Attia et al., "Experimental studies of thermoelectric power generation in dynamic temperature environments," Energy, vol. 60, pp. 453-456, Oct. 1, 2013 (4 pages).
Baetens et al., "Phase change materials for building applications: a state-of-the-art review," Energy and Buildings, vol. 42, Issue 9, pp. 1361-1368, Sep. 2010 (8 pages).
Bajpai et al., "Hybrid renewable energy systems for power generation in stand-alone applications: a review," Renewable and Sustainable Energy Reviews, vol. 16, Issue 5, pp. 2926-2939, Jun. 2012 (14 pages).
Balcerek et al., "Heat-Flux Rectification in Tin-?-Brass System," Physica Status Solidi (a), vol. 47, Issue 2, pp. K125-K128, Jun. 16, 1978 (4 pages).
Balderas-Lopez et al., "Photoacoustic measurements of transparent liquid samples: thermal effusivity," Measurement Science and Technology, vol. 6, No. 8, pp. 1163-1168, 1995 (7 pages).
Barbier, E, "Geothermal energy technolgoy and current status: an overview," Renewable and Sustainable Energy Reviews, vol. 6, Issue 1-2, pp. 3-65, 2002 (63 pages).
Bayramoglu, E. C., "Thermal properties and stability of n-octadecane based composites containing multiwalled carbon nanotubes.", Polymer Composites, vol. 32, Issue 6, pp. 904-909, 2011 (6 pages).
Ben-Abdallah et al., "Phase-change radiative thermal diode," Applied Physics Letters, vol. 103, Article No. 191907, 2013 (4 pages).
Bierman et al., "Enhanced photovoltaic energy conversion using thermally based spectral shaping," Nature Energy, vol. 1, Article No. 16068, May 23, 2016 (7 pages).
Bomberger et al., "Modeling passive power generation in a temporally-varying temperature environment via thermoelectrics," Applied Thermal Engineering, vol. 56, Issues 1-2, pp. 152-158, Jul. 2013 (7 pages).
Boreyko et al., "Planar jumping-drop thermal diodes," Applied Physics Letters, vol. 99, Article No. 234105, 2011 (4 pages).
Boreyko et al., "Vapor chambers with jumping-drop liquid return from superhydrophobic condensers," International Journal of Heat and Mass Transfer, vol. 61, pp. 409-418, Jun. 2013 (10 pages).
Bowen et al., "Pyroelectric materials and devices for energy harvesting applications," Energy and Environmental Science, vol. 7, Issue 12, pp. 3836-3856, 2014 (22 pages).
Buckle et al., "Autonomous Underwater Vehicle Thermoelectric Power Generation," Journal of Electronic Materials, vol. 42, Issue 7, pp. 2214-2220, Jul. 2013 (7 pages).
Chaar et al., "Review of photovoltaic technologies," Renewable and Sustainable Energy Reviews, vol. 15, Issue 5, pp. 2165-2175, Jun. 2011 (11 pages).
Chang et al., "Solid-state thermal rectifier," Science, vol. 314, Issue 5802, pp. 1121-1124, Nov. 17, 2006 (6 pages).
Chao, Y, "Autonomous Underwater Vehicles and Sensors Powered by Ocean Thermal Energy," IEEE, 2016 (4 pages).
Chavez-Urbiola et al., "Solar hybrid systems with thermoelectric generators," Solar Energy, vol. 86, Issue 1, pp. 369-378, Jan. 2012 (10 pages).
Cheknane et al., "Performance of concentrator solar cells with passive cooling," Semiconductor Science and Technology, vol. 21, No. 2, pp. 144-147, 2006 (5 pages).
Chen et al., "Controllable Thermal Rectification Realized in Binary Phase Change Composites," Scientific Reports, vol. 5, Article No. 8884, 2015 (8 pages).

Chen et al., "Experimental and numerical study on melting of phase change materials in metal foams at pore scale," International Journal of Heat and Mass Transfer, vol. 72, pp. 646-655, May 2014 (10 pages).
Chen et al., "Flexible thermal rectifier based on macroscopic PDMS@graphite composite film with asymmetric cone-shape interfaces," Carbon, vol. 126, pp. 464-471, Jan. 2018 (8 pages).
Chen et al., "Three-dimensional flexible and conductive interconnected graphene networks grown by chemical vapour deposition," Nature Materials, vol. 10, pp. 424-428, 2011 (5 pages).
Chenlo et al., "A linear concentrator photovoltaic module: analysis of non-uniform illumination and temperature effects on efficiency," Solar Cells, vol. 20, Issue 1, pp. 27-39, Feb. 1987 (13 pages).
Cottrill et al., "Analysis of Thermal Diodes Enabled by Junctions of Phase Change Materials," Advanced Energy Materials, vol. 5, Issue 23, 2015 (10 pages).
Cottrill et al., "Dual Phase Change Thermal Diodes for Enhanced Rectification Ratios: Theory and Experiment," Advanced Energy Materials, vol. 8, Issue 11, Article No. 1702692, 2018 (11 pages).
Cottrill et al., "Persistent energy harvesting in the harsh desert environment using a thermal resonance device: Design, testing, and analysis," Applied Energy, vol. 235, pp. 1514-1523, Feb. 2019 (10 pages).
Cottrill et al., "Ultra-high thermal effusivity materials for resonant ambient thermal energy harvesting," Nature Communications, vol. 9, Feb. 2018 (11 pages).
Cuadras et al., "Thermal energy harvesting through pyroelectricity," Sensors and Actuators A: Physical, vol. 158, Issue 1, pp. 132-139, Mar. 2010 (8 pages).
Dalal et al., "Design considerations for high-intensity solar cells," Journal of Applied Physics, vol. 48, No. 3, pp. 1244-1251, Mar. 1977 (9 pages).
Dames, C, "Solid-State Thermal Rectification with Existing Bulk Materials," Journal of Heat Transfer, vol. 131, Issue 6, pp. 061301-1 through 061301-7, Jun. 2009 (7 pages).
Dhar et al., "Energy Harvesting and Storage: Materials, Devices, and Applications II," Proceedings of SPIE, vol. 8035, 2011 (351 pages).
El Chaar et al., "Review of photovoltaic technologies," Renewable and Sustainable Energy Reviews, vol. 15, Issue 5, pp. 2165-2175, Jun. 2011 (11 pages).
Elgafy et al., "Effect of carbon nanofiber additives on thermal behavior of phase change materials," Carbon, vol. 43, Issue 15, pp. 3067-3074, Dec. 2005 (8 pages).
Elzouka et al., "High Temperature Near-Filed NanoThermoMechanical Rectification," Scientific Reports, vol. 7, Article No. 44901, 2017 (8 pages).
Farid et al., "A review on phase change energy storage: materials and applications," Energy Conversion and Management, vol. 45, Issues 9-10, pp. 1597-1615, Jun. 2004 (19 pages).
Fiorino et al., "A Thermal Diode Based on Nanoscale Thermal Radiation," ACS Nano, vol. 12, Issue 6, pp. 5774-5779, May 2018 (6 pages).
Freeman et al., "An Assessment of Solar-Thermal Collector Designs for Small-Scale Combined Heating and Power Applications in the United Kingdom," Heat Transfer Engineering, vol. 36, Issues 14-15, pp. 1332-1347, 2015 (17 pages).
Gaddam et al., "A liquid-state thermal diode," International Journal of Heat and Mass Transfer, vol. 106, pp. 741-744, Mar. 2017 (4 pages).
Garcia-Garcia et al., "Thermal rectification assisted by lattice transitions," International Journal of Thermal Sciences, vol. 81, pp. 76-83, Jul. 2014 (8 pages).
Go et al., "On the condition for Thermal Rectification Using Bulk Materials," Journal of Heat Transfer, vol. 132, Issue 12, Article No. 124502, Sep. 2010 (15 pages).
Gu et al., "Asymmetric geometry composites arranged between parallel aligned and interconnected graphene structres for highly efficient thermal rectification," RSC Advances, vol. 7, pp. 10683-10687, 2017 (5 pages).

(56) References Cited

OTHER PUBLICATIONS

Gustafsson et al., "Thermal conductivity, thermal diffusivity, and specific heat of thin samples from transient measurements with hot disk sensors," Review of Scientific Instruments, vol. 65, pp. 3856-3859, 1994 (5 pages).

Gustafsson, S. E., "Transient plane source techniques conductivity and thermal diffusivity measurements of solid materials," Review of Scientific Instruments, vol. 62, No. 3, pp. 797-804, Mar. 1991 (9 pages).

Guyomar et al., "Energy Harvesting from Ambient Vibrations and Heat," Journal of Intelligent Material Systems and Structures, vol. 20, Issue 5, pp. 609-624, Mar. 2009 (16 pages).

Guyomar et al., "Toward Heat Energy Harvesting using Pyroelectric Material," Journal of Intelligent Material Systems and Structures, vol. 20, Issue 3, pp. 265-271, Feb. 2009 (7 pages).

Hamilton et al., "Observations and preliminary science results from the first 100 sols of MSL Rover Environmental Monitoring Station ground temperature sensor measurements at Gale Crater," Journal of Geophysical Research: Planets, vol. 119, Issue 4, pp. 745-770, Apr. 2014 (26 pages).

Harish et al., "Anomalous thermal conduction characteristics of phase change composites with single-walled carbon nanotube inclusions," The Journal of Physical Chemistry, vol. 117, Issue 29, pp. 15409-15413, Jun. 2013 (5 pages).

Hashin et al., "A Variational Approach to the Theory of the Effective Magnetic Permeability of Multiphase Materials," Journal of Applied Physics, vol. 33, Article No. 3125, 1962 (8 pages).

Herbert et al., "A review of wind energy technologies," Renewable and Sustainable Energy Reviews, vol. 11, Issue 6, pp. 1117-1145, Aug. 2007 (29 pages).

Howells, C. A., "Piezoelectric energy harvesting," Energy Conversion and Management, vol. 50, Issue 7, pp. 1847-1850, Jul. 2009 (4 pages).

Hu et al., "Thermal Conductivity and Thermal Rectification in Graphene Nanoribbons: A Molecular Dynamics Study," Nano Letters, vol. 9, No. 7, pp. 2730-2735, Jun. 2009 (6 pages).

Huang et al., "Improved wetting behavior and thermal conductivity of the three-dimensional nickel foam/epoxy composites with graphene oxide as interfacial modifier," Applied Physics A, vol. 112, p. 515, 2016 (7 pages).

International Search Report and Written Opinion for Application No. PCT/US18/49261 dated Oct. 11, 2019 (11 pages).

International Search Report and Written Opinion for Application No. PCT/US18/49265 dated Dec. 13, 2019 (15 pages).

Invitation to Pay Additional Fees for Application No. PCT/US18/49265 issued Oct. 21, 2019 (11 pages).

Ismail et al., "Genetic algorithm based optimization on modeling and design of hybrid renewable energy systems," Energy Conversion and Management, vol. 85, pp. 120-130, Sep. 2014 (11 pages).

Ito et al., "Experimental investigation of radiative thermal rectifier using vanadium dioxide," Applied Physics Letters, vol. 105, Article No. 253503, 2014 (6 pages).

Ito et al., "Multilevel radiative thermal memory realized by the hysteretic metal-insulator transition of vanadium dioxide," Applied Physics Letters, vol. 108, Article No. 053507, 2016 (6 pages).

Jezowski et al., "Heat-Flow Asymmetry on a Junction of Quartz with Graphite," Physica Status Solidi (a), vol. 47, Issue 1, pp. 229-232, May 1978 (4 pages).

Kandilian et al., "The pyroelectric energy harvesting capabilities of PMN-PT near the morphotropic phase boundary," Smart Materials and Structures, vol. 20, Article No. 055020, 2011 (11 pages).

Khamooshi et al., "A Review of Solar Photovoltaic Concentrators," International Journal of Photoenergy, 2014 (18 pages).

Khodayari et al., "Nonlinear pyroelectric energy harvesting from relaxor single crystals," IEEE Transactions on Ultrasonics, Ferroelectrics, and Frequency Control, vol. 56, No. 4, pp. 693-699, 2009 (7 pages).

Kim et al., "Macroscopic Thermal Rectification Device Using Vanadium Dioxide Thin Film," International Journal of Thermophysics, vol. 38, p. 172, 2017 (8 pages).

Kobayashi et al., "An oxide thermal rectifier," Applied Physics Letters, vol. 95, Article No. 171905, 2009 (4 pages).

Kobayashi et al., "Thermal Rectification in the Vicinity of a Structural Phase Transition," Applied Physics Express, vol. 5, Article No. 027302, Jan. 2012 (4 pages).

Kreith et al., "Principles of Heat Transfer," Cengage Learning, Inc., 2011 (784 pages).

Krishnan et al., "Pyroelectric-based solar and wind energy harvesting system," IEEE Transactions on Sustainable Energy, vol. 5, No. 1, pp. 73-81, Jan. 2014 (9 pages).

Kumar, P et al., "Thermal conductivity correlations of open-cell foams: Extension of Hashin-Shtrikman model and introduction of effective solid phase tortuosity," International Journal of Heat and Mass Transfer, vol. 92, pp. 539-549, Jan. 2016 (11 pages).

Kuznik et al., "Optimization of a phase change material wallboard for building use," Applied Thermal Engineering, vol. 28, Issues 11-12, pp. 1291-1298, Aug. 2008 (8 pages).

Lee et al., "Pyroelectric waste heat energy harvesting using heat condition," Applied Thermal Engineering, vol. 37, pp. 30-37, May 2012 (8 pages).

Lertsatitthanakorn et al., "Electricity Generation from a Solar Parabolic Concentrator Coupled to a Thermoelectric Module," Energy Procedia, vol. 52, pp. 150-158, 2014 (9 pages).

Li et al., "Experimental and numerical studies on melting phase change heat transfer in open-cell metallic foams filled with paraffin," Applied Thermal Engineering, vol. 37, pp. 1-9, May 2012 (9 pages).

Li et al., "Interface thermal resistance between dissimilar anharmonic lattices," Physical Review Letters, vol. 95, Article No. 104302, Sep. 2005 (4 pages).

Li et al., "Phase change behavior of latent heat storage media based on calcium chloride hexahydrate composites containing strontium chloride hexahydrate and oxidation expandable graphite," Applied Thermal Engineering, vol. 102, pp. 38-44, Jun. 2016 (7 pages).

Li et al., "Thermal Diode: Rectification of Heat Flux," Physical Review Letters, vol. 93, No. 18, Oct. 2004 (4 pages).

Lissant "The geometry of high-internal-phase-ratio emulsions," Journal of Colloid and Interface Science, vol. 22, Issue 5, pp. 462-468, Nov. 1966 (7 pages).

Lissant et al., "A study of medium and high internal phase ratio water/polymer emulsions," Journal of Colloid and Interface Science, vol. 42, No. 1, pp. 201-208, Jan. 1973 (8 pages).

Liu et al., "A novel PCM of lauric-myristic-stearic acid/expanded graphite composite for thermal energy storage," Materials Letters, vol. 102, pp. 43-46, Apr. 2014 (4 pages).

Lu et al., "Wireless Networks with RF Energy Harvesting: A Contemporary Survey," IEEE Communications Surveys & Tutorials, vol. 17, No. 2, pp. 757-789, Nov. 2014 (33 pages).

Maixner et al., "Assessment of near-surface ground temperature profiles for optimal placement of a thermoelectric device," Energy Conversion and Management, vol. 50, Issue 9, pp. 2361-2365, Sep. 2009 (5 pages).

Maldovan, M, "Sound and heat revolutions in phononics.", Nature, vol. 503, pp. 209-217, Nov. 14, 2013 (9 pages).

Manolakos et al., "On site experimental evaluation of a low-temperature solar organic Rankine cycle system for RO desalination," Solar Energy, vol. 83, Issue 5, pp. 646-656, May 2009 (11 pages).

Martinelli et al., "Experimental study of a phase change thermal energy storage with copper foam," Applied Thermal Engineering, vol. 101, pp. 247-261, May 2016 (15 pages).

Martinez-Flores et al., "Magnon-mediated thermal rectification with forward-bias and breakdown temperatures," Journal of Applied Physics, vol. 114, Article No. 104904, 2013 (9 pages).

Martinez-Perez et al., "Rectification of electronic heat current by a hybrid thermal diode," Nature Nanotechnology, vol. 10, pp. 303-307, 2015 (7 pages).

Marucha et al., "Heat-Flow Rectification in Inhomogeneous GaAs," Physica Status Solidi (a), vol. 31, Issue 1, pp. 269-273, Sep. 1975 (5 pages).

Mbewe et al., "A model of silicon solar cells for concentrator photovoltaic and photovoltaic/thermal system design," Solar Energy, vol. 35, No. 3, pp. 247-258, 1985 (12 pages).

(56) References Cited

OTHER PUBLICATIONS

McKenzie et al., "Groundwater flow with energy transport and water-ice phase change: Numerical simulations, benchmarks, and application to freezing in peat bogs," Advances in Water Resources, vol. 30, Issue 4, pp. 966-983, Apr. 2007 (18 pages).
Meysenc et al., "Power electronics cooling effectiveness versus thermal inertia," IEEE Transactions on Power Electronics, vol. 20, No. 3, pp. 687-693, May 2005 (7 pages).
Moser et al., "Thermoelectric energy harvesting from transient ambient temperature gradients," Journal of Electronic Materials, vol. 41, Issue 6, pp. 1653-1661, Jun. 2012 (9 pages).
Muetze et al., "Ocean Wave Energy Conversion—A Survey," Conference Record of the 2006 IEEE Industry Applications Conference 41st IAS Annual Meeting, pp. 1410-1417, 2006 (8 pages).
Pallecchi, E et al., "A thermal diode and novel implementation in a phase-change material.", Materials Horizons, vol. 2, pp. 125-129, 2015.
Wang, L et al., "Phononics gets hot.", Physics World, vol. 21, Issue 3, p. 27, 2008.

\* cited by examiner

MATERIALS, DEVICES, AND METHODS FOR RESONANT AMBIENT THERMAL ENERGY HARVESTING

CROSS REFERENCE TO RELATED APPLICATION

The present disclosure claims priority to U.S. Provisional Patent Application No. 62/552,497, entitled "Energy Harvesting from Ambient Thermal Fluctuations using a Thermal Resonance Device," which was filed on Aug. 31, 2017, and which is incorporated by reference herein in its entirety.

GOVERNMENT RIGHTS

This invention was made with Government support under Grant No. FA9550-09-1-0700 awarded by the Air Force Office of Scientific Research. The Government has certain rights in the invention.

FIELD

The present disclosure relates to materials, devices, and methods for resonant ambient energy harvesting using thermal resonance devices, and more particularly relates to optimizing capture and conversion of temperature fluctuations to energy by tuning thermal resonance devices to maximize the power output.

BACKGROUND

The global marketplace continues to push for clean energy sources, and thus there remains a substantial interest in developing renewable energy technologies that reduce reliance on coal, oil, and other pollutants that can harm the environment. Environmental thermal energy harvesting has the potential to significantly reduce or even end reliance on previous forms of pollutant causing energy production and can have additional peripheral applications, such as remote powering of sensor networks and miniaturized mobile electronics. Thermal effusivity (e) or thermal inertia is a value that describes the behavior of heat storing or dissipating capability of materials and is equal to a square root of the product of a material's thermal conductivity (k) and the material's volumetric heat capacity (the product of the material's density, $\rho$, and the material's specific heat capacity, $C_p$) (i.e., $e=\sqrt{k\rho C_p}$). In other words, the thermal effusivity is the measure of that material's ability to transfer thermal energy with its surroundings. However, the explicit maximization of thermal effusivity has continued to receive limited attention in materials science. Despite the potential to dynamically capture and store thermal energy from the environment, the development of high thermal effusivity materials remains relatively unexplored, as previously-performed studies have mainly focused on enhancing either the thermal conductivity or the thermal capacitance of materials while neglecting the significance of thermal effusivity.

Existing thermal energy harvesting technologies can be divided into static and transient approaches, each of which has several shortcomings. Solar thermal energy harvesting, for example, which uses static temperature gradients from thermoelectric devices situated in specific locations, is limited by the large thermal conductivities of the constituent materials. This set-up reduces the applied gradient and the efficiency of conversion of associated thermal energy conversion devices. Transient approaches to thermal energy harvesting, on the other hand, largely fail to consider ambient and generic thermal fluctuations that occur in the environment as a persistent, renewable energy source to augment existing technologies. In the case of pyroelectric energy harvesters, for example, which have been developed for harvesting from high frequency personal temperature variations and wind-induced temperature variations, have been shown to have a higher conversion efficiency compared to static thermoelectric energy harvesting. However, the power generated by pyroelectricity is strongly limited by its reliance on high frequency temperature variations. Moreover, transient thermal energy harvesting has been proposed for harvesting energy from temperature differences between ambient air and large thermal capacitors (e.g., building walls or soil) with thermoelectrics, as well as tuning heat exchanger parameters, in a lumped analysis considering small Biot numbers, on either side of a thermoelectric. However, each of these strategies have not been optimized—at least in terms of material and device designs—to obtain the maximum power generation from generic, broadband, and ambient temperature fluctuations that exist in the environment.

One manufacturing technique that has gained some traction in the energy harvesting space for optimal energy harvesting from static thermal energy gradients is the incorporation of more efficient thermoelectric devices. Moreover, it should also be noted that recent efforts have focused on thermoelectric energy harvesting from diurnal and aircraft-related temperature changes with the employment of phase-change materials for latent heat storage. However, naturally-occurring, ambient thermal fluctuations lead to inefficiencies in energy harvesting at least due to the inability of heat exchangers to absorb the temperature differences, which can lead to dramatic reductions in power output. Further, the material and design criteria of thermal effusivity for these thermoelectric devices is not sufficiently understood to allow for existing thermoelectric devices to adapt to these thermal fluctuations.

Accordingly, there is a need to be able to manufacture and use thermal energy harvesting devices that are capable of achieving optimal power output. There is a further need to be able to determine methods to tune materials to achieve optimal performance at a target frequency of temperature oscillations that are not limited to high frequency temperature fluctuations.

SUMMARY

The present disclosure relates to the use of thermal effusivity to generate power. More particularly, ambient temperature fluctuations from an environment are converted to power (e.g., electrical energy) by thermal resonance devices, also referred to herein as thermal resonators or energy harvesting devices. The devices generally include two thermal components, with an energy conversion component disposed between the two thermal components. The thermal components can be thermal masses or thermal diodes, for example, and the energy conversion component can be a heat engine or a thermoelectric, for example. The thermal components can be tuned to optimize an amount of energy that is generated by the thermal resonance device. A variety of ways by which the thermal components can be tuned are provided. By way of non-limiting examples, a spatial and temporal gradient can be optimized, and/or a temperature oscillation frequency can be optimized, and/or a difference between thermal diffusion time scales of the thermal components can be optimized. The end result is that an ambient temperature fluctuation that exists in or near an environment in which the thermal resonance device is placed (e.g., diurnal temperature cycles, duty cycles, underwater temperature fluctuations, aerial temperature fluctuations, personal temperature fluctuations, and device fluctuations induced by duty cycles, among others provided for herein) is converted into power by the thermal resonance device.

One non-limiting feature of the thermal resonance device is that it includes one or more ultra-high effusivity materials that enhance performance of the device. Parameters that define the effusivity of thermal components (e.g., thermal masses) of the resonance device, such as a thermal conductivity of the material(s) used to form the thermal component(s), a density of the material(s) used to form the thermal component(s), and/or one of a specific heat capacity of the material(s) used to form the thermal component(s) or a latent heat of the material(s) used to form the thermal component(s) can be altered to provide for a desired power output. Performance factors associated with the thermal component(s) can be determined, and, based on those determinations, parameters of the thermal resonance device can be adjusted to provide for a desired power output.

As provided for herein, the thermal resonance devices can be incorporated into pre-existing objects. In some such instances, the thermal resonance devices apply the produced power to the pre-existing objects (e.g., a building, car, bench, etc., as provided for below), or to components of or associated with the pre-existing objects. Further, in some instances, the pre-existing object itself can be incorporated as part of the thermal resonance device, thereby turning the pre-existing device into an object that can generate power. That is, the pre-existing object becomes a thermal resonance device.

In one exemplary embodiment of an energy harvesting device, the device includes a first thermal mass, a second thermal mass, and a heat engine disposed between the first and second thermal masses. Each of the first and second thermal masses have a thermal diffusion time scale, the first and second thermal diffusion time scales, respectively, and the heat engine is configured to translate a spatial temperature difference between the first and second thermal masses into power. At least one of the first thermal mass or the second thermal mass is tuned based on the respective first and second thermal diffusion time scales such that the spatial temperature difference exists across the heat engine for power extraction.

The energy harvesting device can be configured to produce a dual polarity voltage output. In some embodiments, at least one of the first thermal mass or the second thermal mass can include one or more ultra-high thermal effusivity materials. The ultra-high thermal effusivity material(s) can be disposed within a housing of the first and/or second thermal mass such that the ultra-high thermal effusivity material(s) substantially fills a volume of the housing. The ultra-high thermal effusivity material(s) can include at least one of a Cooper/Graphene/Octadecane (Cu/G/OD) phase-change material composite or a Nickel/Graphene/Octadecane (Ni/G/OD) phase-change material composite.

Each of the first diffusion time scale and the second diffusion time scale can be controlled by a thermal effusivity of the respective first and second thermal masses. In some such instances, the thermal effusivity can be controlled by each of: (1) a thermal conductivity of the respective first thermal mass and second thermal mass; (2) a density of the respective first thermal mass and second thermal mass; and (3) a specific heat capacity of the respective first thermal mass and second thermal mass. In some other instances, the specific heat capacity can be replaced by a latent heat of the respective first thermal mass and second thermal mass.

At least one of the first thermal mass or the second thermal mass can include a heat fin. The heat engine can be configured to be coupled to the second thermal mass in instances in which the second thermal mass includes a pre-existing object (e.g., a building, car, bench, etc., as provided for below). In some embodiments, the first thermal mass can be a dominant thermal mass with respect to the second thermal mass. The energy harvesting device can include a monitor that is in communication with the energy harvesting device and is configured to acquire data related to at least one of the energy harvesting device or an environment surrounding the energy harvesting device. The device can further include a microprocessor that can be configured to adjust one or more parameters of the energy harvesting device and/or the environment surrounding the energy harvesting device in response to the data acquired by the monitor.

The first and/or second thermal masses being tuned based on the respective first thermal diffusion time scale or the second thermal diffusion time scale can be tuned based on at least one of: (1) a size of the first and/or second thermal masses; or (2) a thermal effusivity of the first and/or second thermal masses. Alternatively, or additionally, the first and/or second thermal masses being tuned based on the respective first thermal diffusion time scale or the second thermal diffusion time scale can be tuned based on a temperature oscillation frequency of the first and/or second thermal masses such that the power generated by the heat engine is optimized.

Another exemplary embodiment of an energy harvesting device includes a first thermal component, a second thermal component, and an energy conversion component that is disposed between the first and second thermal components. The energy conversion component is configured to translate ambient temperature fluctuations from an environment surrounding the first and second thermal components into electrical energy. At least one of the first thermal component or the second thermal component is tuned based on at least one of: (1) an optimized spatial and temporal gradient; and (2) an optimized temperature oscillation frequency of the energy harvesting device.

In some embodiments, the first thermal component can include a first thermal mass and the second thermal component can include a second thermal mass. In some such embodiments, the first thermal mass can be a dominant thermal mass with respect to the second thermal mass. In some other embodiments, the first thermal component can include a first thermal diode and the second thermal component can include a second thermal diode.

The energy conversion component can include a heat engine. Alternatively, the energy conversion component can include a thermoelectric.

At least one of the first thermal component or the second thermal component can include one or more ultra-high thermal effusivity materials. In some such embodiments, the ultra-high thermal effusivity material(s) can be disposed within a housing of the first and/or second thermal component such that the ultra-high thermal effusivity material(s) substantially fills a volume of the housing. The ultra-high thermal effusivity material(s) can include at least one of a Cooper/Graphene/Octadecane (Cu/G/OD) phase-change material composite or a Nickel/Graphene/Octadecane (Ni/G/OD) phase-change material composite.

The first and/or second thermal component can be tuned based on a thermal effusivity of the respective first and second thermal component. In some such instances, the thermal effusivity can be controlled by each of: (1) a thermal conductivity of the respective first thermal component and second thermal component; (2) a density of the respective first thermal component and second thermal component; and (3) a specific heat capacity of the respective first thermal component and second thermal component. In some other instances, the specific heat capacity can be replaced by a latent heat of the respective first thermal component and second thermal component.

At least one of the first thermal component or the second thermal component can include a heat fin. The energy conversion component can be configured to be coupled to the second thermal component in instances in which the second thermal component includes a pre-existing object (e.g., a building, car, bench, etc., as provided for below). An energy harvesting device can include a monitor that is in communication with the energy harvesting device and configured to acquire data related to at least one of the energy harvesting device or an environment surrounding the energy harvesting device. The device can further include a microprocessor that can be configured to adjust one or more parameters of the energy harvesting device and/or the environment surrounding the energy harvesting device in response to the data acquired by the monitor.

The first and/or second thermal component being tuned based on at least one of: (1) an optimized spatial and temporal gradient; and (2) an optimized temperature oscillation frequency of the energy harvesting device can be tuned based on at least one of: (1) a size of the first and/or second thermal components; or (2) a thermal effusivity of the first and/or second thermal components.

An exemplary method of harvesting energy includes operating a thermal resonance device to: (1) measure an ambient temperature fluctuation of an environment; and (2) convert the ambient temperature fluctuation into power.

In some embodiments, the method can further include causing at least a portion of the power that results from converting the ambient temperature fluctuation into power to be stored. Alternatively, or additionally, the method can further include causing at least a portion of the power that results from converting the ambient temperature fluctuation into power to be used to: (1) power one or more components of the thermal resonance device; and/or (2) power one or more components associated with the thermal resonance device.

The method can include placing the thermal resonance device in an environment that is subject to an ambient temperature fluctuation. In some such embodiments, the placing action can include attaching the thermal resonance device to a pre-existing structure. Further, the method can include allowing the power to provide power to at least one of the pre-existing structure or a component associated with the pre-existing structure.

In some embodiments the method can include determining a performance factor of at least one thermal mass of the thermal resonance device and optimizing the amount of power that is converted by the thermal resonance device in view of the determined performance factor. Alternatively, or additionally, the method can include optimizing the amount of power that is converted by the thermal resonance device by adjusting a thermal effusivity of at least one thermal component of the thermal resonance device. Adjusting a thermal effusivity of a thermal component(s) of the thermal resonance device can include adjusting a length of the thermal component(s).

The method can further include operating a monitor to acquire data related to the thermal resonance device and/or the environment. One or more parameters of the thermal resonance device and/or the environment can be caused to be adjusted in view of the acquired data.

The thermal resonance device can include at least one thermal component that includes at least one ultra-high effusivity material. The ultra-high thermal effusivity material(s) can include at least one of a Cooper/Graphene/Octadecane (Cu/G/OD) phase-change material composite or a Nickel/Graphene/Octadecane (Ni/G/OD) phase-change material composite.

BRIEF DESCRIPTION OF DRAWINGS

This disclosure will be more fully understood from the following detailed description taken in conjunction with the accompanying drawings, in which.

DETAILED DESCRIPTION

Figure 1A:
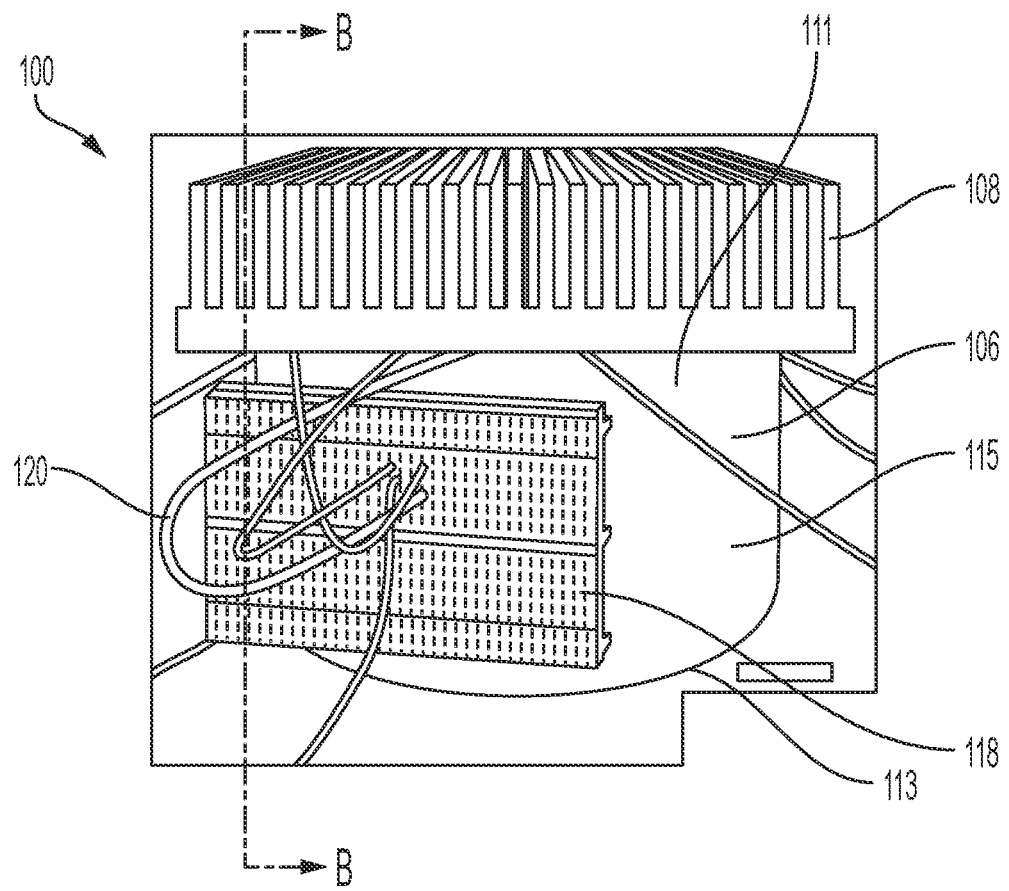
FIG. 1A is a perspective view of one exemplary embodiment of a thermal resonance device.

Certain exemplary embodiments will now be described to provide an overall understanding of the principles of the structure, function, manufacture, and use of the materials, devices, and methods disclosed herein. One or more examples of these embodiments are illustrated in the accompanying drawings. Those skilled in the art will understand that the materials, devices, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention. Further, to the extent features, sides, or steps are described as being "first" or "second," such numerical ordering is generally arbitrary, and thus such numbering can be interchangeable. Still further, in the present disclosure, like-numbered components of various embodiments generally have similar features when those components are of a similar nature and/or serve a similar purpose.

It will be appreciated that, for convenience and clarity, spatial terms such as "top," "bottom," "up," and "down," may be used herein with respect to the drawings. However, these systems can be set-up using various orientations and positions, and these terms are not intended to be limiting and/or absolute. To the extent that linear or circular dimensions are used in the description of the disclosed materials, devices, and methods, such dimensions are not intended to limit the types of shapes that can be used in conjunction with such materials, devices, and methods. A person skilled in the art will recognize that an equivalent to such linear and circular dimensions can easily be determined for any geometric shape. Further, the terms "in" and "on" may be used interchangeably to describe forming a particular configuration (e.g., placing or embedding a thermal resonance device) with respect to an existing thermal mass, and a person skilled in the art will recognize that usage of one of the terms "in" and "on" can cover both "in" and "on." Additionally, a number of different terms can be used interchangeably while still being understood by the skilled person. By way of non-limiting example, the terms "thermal resonators" and "thermal resonance devices" are generally used interchangeably, as are the terms "thermal fluctuations" and "temperature fluctuations," among others. Further, the present disclosure includes some illustrations and descriptions that include prototypes or bench models. A person skilled in the art will recognize how to rely upon the present disclosure to integrate the techniques, materials, devices, and methods provided for into a product in view of the present disclosures.

The present disclosure generally relates to materials, devices, and methods for resonant ambient thermal energy harvesting. Ambient thermal energy can be harvested by thermal resonance devices, also referred to herein as thermal resonators, that capture energy from ambient thermal fluctuations of various frequencies. The resonators are transient thermal energy harvesting devices that can produce a steady, persistent power output. Thermal resonators can be durable and stable energy harvesters, especially for remote locations. In some embodiments, the thermal resonance device can be a self-contained device capable of a broadband input of a range of temperature waveforms for direct conversion to electrical energy. The energy harvested by the thermal resonators can produce a steady, persistent power output. The ability of thermal resonators to harvest ambient energy to generate persistent electrical power from thermal fluctuations over large ranges of frequencies is a measure of a material's ability to transfer thermal energy with its surroundings, otherwise known as thermal effusivity or thermal inertia.

In accordance with the present disclosures, high thermal effusivity or high thermal inertia materials can be used in a variety of objects, such as electronic circuits, off-peak electricity storage, energy-saving buildings, and chemical reactors. For example, use of high thermal effusivity materials, when tuned to an ideal frequency as provided for herein, can improve the average power output of the material. Moreover, the present disclosure also provides for the ability to modify high effusivity materials to form ultra-high effusivity materials, thereby further enhancing the ability of the material to dynamically capture and store ambient thermal energy. Some non-limiting examples of these ultra-high effusivity materials can include graphene-modified copper and nickel foams, which can be impregnated with octadecane as a standard ambient phase-change material to create a composite. Incorporating multilayer graphene into thermal resonators to create composites can significantly enhance the ability of the phase-change composite to efficiently capture and store thermal energy, hence maximizing its thermal effusivity and boosting the average power output significantly as compared to the high effusivity material. High effusivity materials provide for enhanced performance with respect to thermal resonators, nevertheless, as compared to standard, non-phase-change materials, as well as previous devices used in conjunction with energy generation and storage. Thermal resonance devices having high and ultra-high effusivity materials incorporated therein can be sources that are not limited by intermittency and can be capable of persistent and continuous operation over extended periods of time to generate a steady power output. Features of ultra-high effusivity materials can also be adjusted to maximize the efficiency of storage and conversion of energy from thermal fluctuations.

Maximum power output can be achieved through the use of ultra-high thermal effusivity materials that are specifically tuned to the dominant frequency of a temperature waveform. In contrast to pyroelectrics, which rely on a static thermal gradient imposed upon a thermoelectric device, a thermal resonator in accordance with the present disclosure can be tuned for optimal performance at a target frequency of temperature oscillations, while not being limited to high frequency temperature fluctuations. Thermal noise, or fluctuations, exist practically everywhere.

A person of skill in the art will recognize that values of ambient thermal fluctuations can vary greatly based on the frequencies of objects being measured. For example, ambient thermal fluctuations of the outdoor diurnal cycle (e.g., 10 µHz), fluctuations surrounding an active human body (e.g., 10 mHz), and laptop computers (e.g., 50 mHz) can be used as ubiquitous sources of energy. For example, ambient thermal fluctuations occurring in the environment, such as those that can be attributed to the diurnal temperature cycle, can be highly persistent in a variety of environments worldwide with amplitudes of approximately 10° C. and median temperatures depending on the geographical location. Moreover, the diurnal temperature fluctuations, e.g., about 10 µHz, can extend both below ground and beyond earth, with these fluctuations having important possibilities for energy harvesting in space applications. By way of further example, movement-induced temperature fluctuations, e.g., altitude, sea depth, and so forth, can also be an ubiquitous source for energy harvesting. The existence of low-grade temperature gradients throughout the environment, when coupled with motion, can create a variety of temperature fluctuations for energy harvesting. Some non-limiting examples of movement-induced temperature fluctuations can include atmospheric lapse rate with respect to altitude for a drone in flight, e.g., temperature fluctuation amplitudes of approximately 1° C. at altitudes less than approximately 100 meters, atmospheric lapse rate for an aircraft in flight, e.g., temperature fluctuation amplitudes of approximately 30° C. for altitudes up to approximately 7500 meters, and a Bluetooth-enabled temperature sensor of a cell phone, e.g., temperature fluctuations centered around approximately 27° C. and characterized by an amplitude of approximately 10° C.

The frequencies can be tuned to the frequency mode of one or more of these environmental temperature oscillations to optimize the spatial and temporal gradient of thermal energy across a heat engine for persistent power extraction and robust ambient energy harvesting, while achieving optimum performance. In some embodiments, one or more thermal resonance devices can be set up between two or more masses, each mass being of a different value, with a heat engine disposed between the two masses. In such embodiments, the power harvested by these devices can be directly proportional to the thermal effusivity of the dominant thermal mass. In some other embodiments, one or more thermal resonance devices can be set up between two or more thermal diodes, with a heat engine disposed between the two diodes. In such embodiments, the power harvested by these devices can be related to the level of thermal rectification characteristics of the thermal diodes. While the relationship is more complex than that of power output and thermal effusivity, it can be controlled, at least in part, by a thermal rectification ratio:

$$Q = \frac{|J_f|}{|J_r|}(Q \neq 1),$$

in which the performance of the thermal diode is represented by Q, and the forward and reverse steady state heat fluxes being represented by $J_f$ and $J_r$, respectively. One skilled in the art will recognize that in some embodiments the thermal rectification ratio can be quantified as the ratio of the magnitudes of the reverse ($J_r$) and forward ($J_f$) steady state heat fluxes to quantify thermal diode performance (Q). It will be appreciated that when Q=1, the performance no longer applies to diodes but rather to linear thermal elements, such as those provided for herein. Thermal rectification is the action of converting a time and directionally varying heat flux into a single polarity temperature gradient. As a result of the present disclosures, everyday objects that are typically incapable of energy generation can be transformed into thermal resonance devices, thus allowing the objects to generate energy while not sacrificing the functionality of the objects.

The present disclosure provides for thermal resonance devices, systems, and methods for energy harvesting. To help illustrate and describe such thermal resonance devices, and their related disclosures, first a thermal resonance device, and its potential uses, is described, and then the particular components of the thermal resonance device, and optimization of the same, is detailed. The thermal resonance devices of the present disclosure benefit from optimized thermal effusivity of the thermal components of the resonance devices (e.g., masses, thermal diodes, etc.).

Figure 1B:
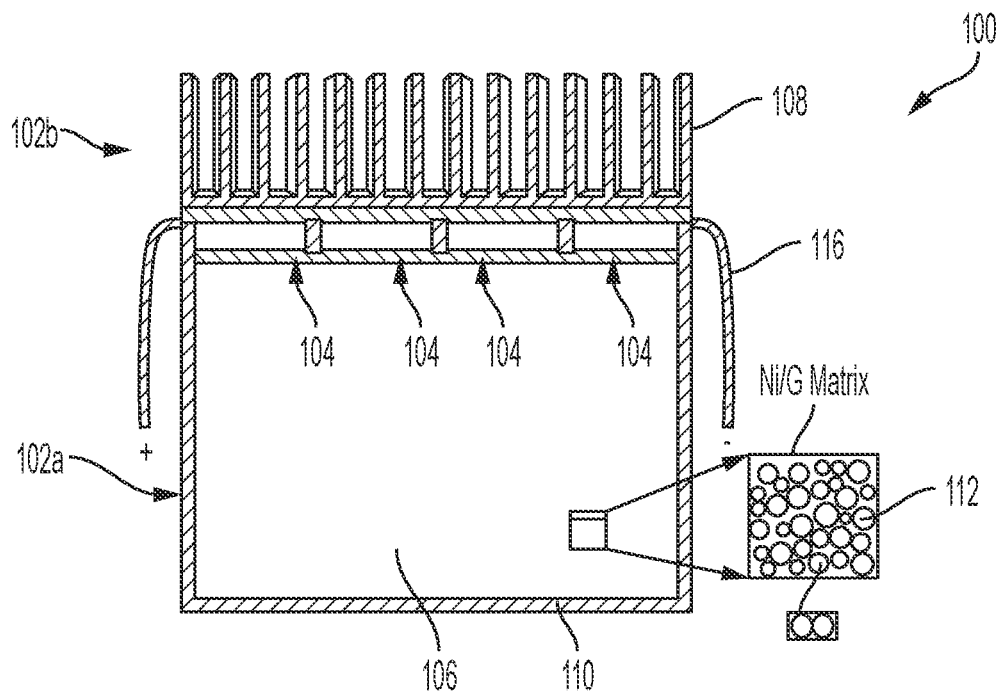
FIG. 1B is a side cross-sectional view of the thermal resonance device of FIG. 1 taken along line B-B.

FIGS. 1A and 1B illustrate one exemplary embodiment of a thermal resonance device, or resonator, 100 capable of harvesting energy from ambient temperature fluctuations. Ambient temperature fluctuations can occur in the environment as a result of natural activities that cause disturbances in the air to alter a temperature of the surroundings. A variety of time varying temperature baths exist at a variety of frequencies. Some non-limiting examples of these baths can include the diurnal temperature cycle, various duty cycles, underwater temperature fluctuations (enhanced by spatial movement), aerial temperature fluctuations (enhanced by movement, e.g., lapse rate), personal temperature fluctuations surrounding one's body during daily activities, and device fluctuations induced by duty cycles and use of electronics and other similar devices throughout the day (e.g., a cellular telephone). These temperature fluctuations can be captured and stored by the thermal resonator for conversion into usable energy, e.g., power. The power generated is persistent and highly applicable to powering objects ranging from electronics to vehicles and heavy machinery.

The thermal resonator shown in FIG. 1A includes two thermal components, as shown two masses 102a, 102b, separated by a heat engine 104, e.g., a plurality of thermoelectric modules, although in some instances a single module can be used, with the masses being exposed to an ambient temperature profile. The first and second masses 102a, 102b can be configured to capture the ambient thermal fluctuations and, using the heat engine 104, translate a resulting spatial temperature difference into electrical energy. The efficiency with which the masses 102a, 102b can capture the thermal fluctuations can be determined by the frequency to which they are tuned, as described further below. In some embodiments, the thermal masses 102a, 102b can be tuned to the dominant frequency of the temperature fluctuations to capture maximum amounts of temperature fluctuations to yield larger power outputs. When tuned to the dominant frequency of the fluctuations, the energy can be generated on a substantially persistent basis such that the thermal resonator can generate heating and/or cooling throughout the cycles of the day. Generating energy on a substantially persistent basis can refer to the power output being persistently non-zero throughout the energy harvesting period, except at two points of the day when the cycles switch from heating to cooling and vice versa, during which time no power output is generated.

As shown, the thermal resonator 100 can include a base portion 106 as the first mass 102a in communication with a heat fin 108 as the second mass 102b. In the illustrated embodiment the base portion 106 includes a substantially cylindrical body or housing 110 having a top surface 111 opposed to a bottom surface 113, and a curved wall 115 extending therebetween, though, in other embodiments the base portion 106 can have other shapes, such as various types of prisms, pyramids, and other shapes known to one skilled in the art. It will be appreciated that although cylinders may be easier to manufacture the base portion, prisms and similarly shaped containers can be better suited for heat engines as more material can be packed into the base portion to increase the thermal effusivity of the resulting thermal resonator.

The housing 110 can be made from one or more non-phase-change material, e.g., Teflon, wood, etc., that can capture and store thermal energy from ambient thermal fluctuations. Non-phase-change materials are standard materials that typically have low conductivity and lack high thermal effusivity. Use of non-phase-change materials in the thermal resonance device of the present disclosure can produce a low energy output. When non-phase-change materials are tuned to an ideal frequency of the ambient temperature waveform, as described further below, the energy output can be sufficient to power sensor nodes, radio frequency-based communications, and various other small electronics, as well as charging batteries. A person skilled in the art, in view of the present disclosures, will understand various ways this can be achieved. Some additional non-limiting examples of materials making up the housing 110 can include Styrofoam, PVC, neoprene foam, neoprene rubber, and so forth. Thermal conductivity and volumetric heat capacity data for several of these materials were obtained via a standard Transient Plane Source (TPS 2500S) device with the settings shown below:

1-styrofoam [k=0.039 W m$^{-1}$K$^{-1}$; $\rho C_p$=0.033 MJ m$^{-3}$K$^{-1}$] [P$_0$=10 mW; 40 s; points 24-98]

2-neoprene foam [k=0.053 W m$^{-1}$ K$^{-1}$; $\rho C_p$=0.106 MJ m$^{-3}$K$^{-1}$] [$P_0$=15 mW; 40 s; points 24-98]

3-wood [k=0.152 W m$^{-1}$K$^{-1}$; $\rho C_p$=0.454 MJ m$^{-3}$K$^{-1}$] [$P_0$=60 mW; 40 s; points 32-98]

4-PVC [k=0.231 W m$^{-1}$K$^{-1}$; $\rho C_p$=1.406 MJ m$^{-3}$K$^{-1}$] [$P_0$=75 mW; 160 s; points 44-111]

5-Teflon [k=0.310 W m$^{-1}$K$^{-1}$; $\rho C_p$=1.717 MJ m$^{-3}$K$^{-1}$] [$P_0$=100 mW; 80 s; points 44-111]

6-neoprene rubber [k=0.452 W m$^{-1}$K$^{-1}$; $\rho C_p$=1.744 MJ m$^{-3}$K$^{-1}$] [$P_0$=150 mW; 80 s; points 32-98].

In some embodiments, the housing 110 can include a conductive surface thereon, such as a copper surface by way of non-limiting example, to receive and send heat and energy within the thermal resonance device. The conductive surface can be added to the housing 110 to limit thermal resistance for delivering heat from the high thermal effusivity material stored by the housing to the heat engine 104, as described further below. A person skill in the art will appreciate that although the housing 110 in the present disclosure is made of non-phase-change materials, in some embodiments, the housing can be made of a high effusivity and/or ultra-high effusivity material.

In some embodiments, the housing 110 can be hollow to store one or more materials (e.g., phase-change materials, which are described in further detail below) therein that are configured to enhance the capture and storage of ambient thermal energy within the base portion 106. For example, the housing 110 can include an inner composite 112 disposed therein. The inner composite 112 can be made from various materials that have high effusivity characteristics for efficiently capturing thermal energy therein. In some embodiments, the inner composite 112 can substantially fill the entire volume of the housing to minimize loss of thermal energy during transfer through the housing. A person skilled in the art will appreciate that the greater the volume of inner composite 112 within the housing 110, the more efficiently the base portion 106 can capture, store, and transfer ambient thermal energy. Further, the inner composite 112 can be configured to further enhance the ability of the resonator 100 to capture ambient temperature fluctuations and transfer the thermal energy through the housing, as described further below. A person skilled in the art, in view of the present disclosures, will understand various ways this can be achieved.

In some embodiments, the inner composite 112 can include one or more high thermal effusivity or ultra-high thermal effusivity materials to enhance the capture and transfer of thermal energy. High thermal effusivity materials typically have a high heat storage capacity and good thermal conductivity, while ultra-high thermal effusivity materials perform even better with respect to their storage capacity and thermal conductivity, as described further below, at least with respect to FIG. 1C. The present disclosure describes in greater detail ways by which ultra-high thermal effusivity materials can be created and utilized in conjunction with thermal resonance devices. In some embodiments, the inner composite 112 can include a phase-change material (PCM), or a PCM composite that has an ultra-high effusivity. For example, and as described further below, the inner composite 112 can include octadecane (OD) as the PCM in a matrix of copper or nickel foam to form a PCM composite (e.g., Cu/G/OD or Ni/G/OD) having an ultra-high thermal effusivity. Some additional non-limiting examples of the inner composite 112 can include PCMs within highly thermally conductive matrices, high thermal conductivity particles dispersed in PCMs, microencapsulated PCMs, nanoparticles in PCMs, and hydrated salts.

Figure 1C:
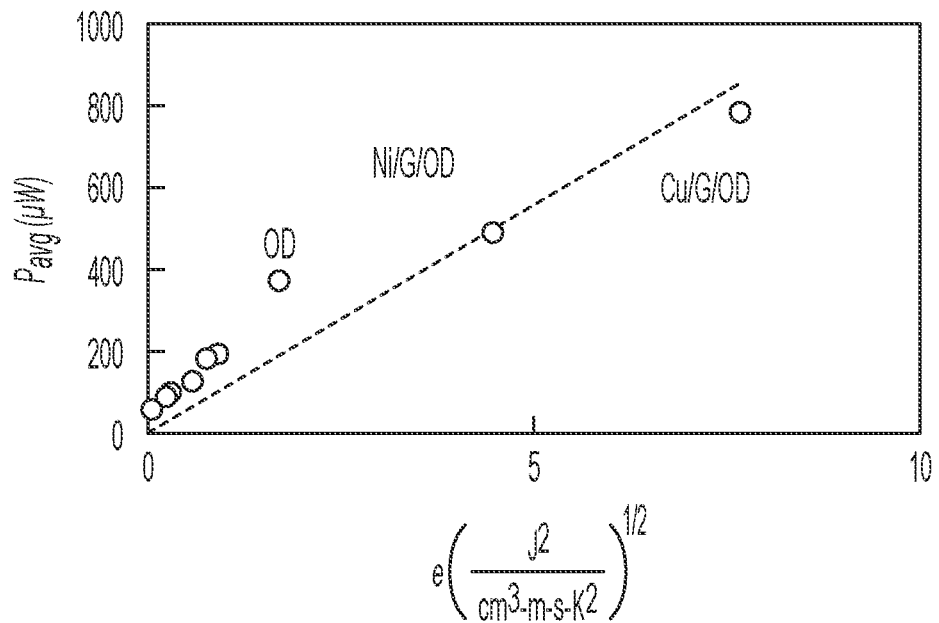
FIG. 1C is a graph illustrating a time-averaged power output of a variety of thermal resonance devices as a function of thermal effusivity for a variety of first thermal masses.

FIG. 1C illustrates a time-averaged power output ($P_{avg}$) of thermal resonators, such as the thermal resonator 100, as a function of the thermal effusivity for multiple embodiments of a first thermal mass, such as the first mass 102a. For example, the thermal effusivity and power output of non-phase-change materials, in these instances Styrofoam, neoprene foam, wood, PVC, Teflon, and neoprene rubber, is shown by the unlabeled dots of FIG. 1C. Further, the thermal effusivity and power output of a phase-change material, in this instance OD, and of ultra-high effusivity materials, in two instances Cu/G/OD and Ni/G/OD, is shown by the respectively labeled dots of FIG. 1C. As shown by the data points, the OD can outperform (has a higher time-averaged power output ($P_{avg}$)) than the non-phase-change materials by at least a factor of 2, or even more. Further, the ultra-high effusivity material Ni/G/OD can outperform the OD by at least 100 µW, and thus by as much as a factor of 2.5, or even more, with respect to the non-phase-change materials. The ultra-high effusivity material Cu/G/OD has even better performance, outperforming the OD by as much as a factor 2 (about 800 µW as compared to about 400 µW), and thus by as much as a factor of 4, or even more, with respect to the non-phase-change materials. One skilled in the art will recognize that for more detailed comparisons between thermal effusivities of phase-change and non-phase-change materials, knowledge of the values of the amplitude of temperature fluctuations is helpful.

In some embodiments, the PCM can be a material that can melt and resolidify at room temperature, e.g., paraffins such as OD, as discussed above, hexadecane, eicosane. In colder climates, water can be used as a PCM. The PCM can be packed and/or stacked within the thermal mass to maximize the amount of ambient thermal fluctuations captured by the material. In some embodiments, one or more of the thermal masses 102a, 102b can be fabricated from a PCM. Methods for fabrication of the inner composite 112 made up of high and ultra-high effusivity materials that can be added to thermal masses 102a, 102b are described in detail below. Additionally, to the extent various disclosures describe the use of a high thermal effusivity material or an ultra-high thermal effusivity material, a person skilled in the art will understand that the use of such materials can be interchangeable and/or combined, and thus such descriptions are generally not limiting to allow only use of that named material, or type of material, in that configuration.

The inner composite 112 composite can be added to the housing 110 in a variety of ways. The phase-change material of the inner composite 112 can be made of a single, solid structure, though, in some embodiments the phase-change material can be stacked in layers relative to the direction of heat flow. For example, in some embodiments the phase-change material can be stacked in series relative to the direction of heat flow, which can be done for ease of fabrication. In some embodiments, the phase-change material can be stacked in parallel with the heat flow to more closely reflect the measured thermal effusivities.

In the illustrated embodiment, the second mass 102b is the heat fin 108. As shown, it can be disposed on the opposite side of a heat engine 104 than the first mass 102a, the base portion 106. Thus, in the illustrated embodiment the heat fin 108 is also located above the top surface of the base portion 106. A person skilled in the art will recognize other configurations are possible, such as having the heat fin 108 disposed below the bottom surface 113, and/or form any exterior surface of the base portion 106, and such various configurations can be achieved without departing from the spirit of the present disclosure. The heat fin 108 can itself be one of the two masses 102a, 102b of the thermal resonator 100, as shown, or it can be an addition to a mass of a thermal resonator that already has multiple masses to increase a surface area of that mass. Use of a heat fin can increase the size of a mass, which can increase the rate of heat transfer to and/or from the environment by increasing convection therefrom. The amount of conduction, convection, and/or radiation can determine an amount of heat a mass transfers to and/or from it. One skilled in the art will appreciate that the length of the fins of the heat fin 108, as well as the number of fins, can vary, at least in part, in view of a size of the surface area of the second mass, a desired heat transfer rate, and the size, shape, and configuration of other components of a thermal resonance device, thereby varying the rate of heat transfer to and/or from the environment.

The heat fin 108 can be made from materials having varying conductivities, including but not limited to aluminum, nickel, copper, iron, and titanium, among others. The materials can be a single material, or they can be a combination of materials. High conductivity materials can allow the heat fin to efficiently transfer thermal energy through the thermal resonator 100 to maximize efficiency. A person skilled in the art, in view of the present disclosures, will understand various sizes, shapes, and configurations of heat fins that can be used in conjunction with thermal resonance devices provided for herein or otherwise derivable therefrom without departing from the spirit of the present disclosures.

The heat engine 104 can be disposed between the first thermal mass 102a and the second thermal mass 102b. As shown, the heat engine 104 is disposed on top of, or otherwise extends from, the top surface 111 of the base portion 106, and has the fin 108 disposed above it. The heat engine 104 can include one or more modules 114. As shown, the modules 114 can be thermoelectric modules that are disposed between the base portion 106 and the heat fin 108 to convert a spatial time difference over the masses 102a, 102b into power. The modules 114 can be wired in series, as shown, though, in some embodiments the modules 114 can be wired in parallel. The modules 114 can be made from bismuth telluride ($Bi_2Te_3$) or another material known in the art to provide power generation. As shown, three 4.0 cm×4.0 cm commercial $Bi_2Te_3$ thermoelectrics (TEG2-126LDT) are wired as the devices' modules 114, though a person skilled in the art, in view of the present disclosures, will understand the size, number, characteristics, and configuration of modules can vary. The modules 114 can be wired together by one or more leads 116 having positive and negative ends that pass through the modules 114 to set up a voltage difference across the thermal resonator 100 to allow the modules 114 to convert the thermal fluctuations into energy. One skilled in the art will appreciate that one or more of the modules 114 can be wired to a resistor of various ohms, e.g., a 100Ωresistor, to help reduce current flow, adjust signal levels, and divide voltages in the thermoelectric modules.

In other embodiments, rather than thermal masses 102a, 102b, the thermal components disposed on opposed sides of the heat engine 104 can be thermal diodes. A thermal diode is a non-linear heat transfer element with a preferential direction for heat flow and the thermal analog to an electrical diode. It is a passive device that exhibits a difference in thermal conductance depending on the sign of the gradient or direction of the thermal heat flux. The thermal diode, or thermal rectifier, is one example of a non-linear heat transfer element that can be used in conjunction with the thermal resonance devices provided for herein or otherwise derivable from the present disclosures. The thermal diodes can be incorporated into the thermal resonators in addition to, and/or in lieu of high thermal effusivity materials, to enhance thermal resonator performance. In some embodiments, the thermal diodes can be formed from a junction of a phase-change material and a phase invariant material.

The thermal diodes can interface with external boundaries of the resonator to enable operation at ambient temperatures. The diodes are able to directly capture and transform ubiquitous temperature fluctuations into single polarity voltages and bypass a dual polarity voltage output. That is, in view of the single polarity voltage design provided for by the present disclosure, circuitry typically required for electrical rectification in a dual polarity set-up can be bypassed. In some embodiments, passive thermal diodes can be incorporated into a thermal diode bridge, which can take an oscillatory temperature waveform (bipolar temperature oscillations) as an input and transform them into a single polarity temperature difference. Additional details about thermal diodes are provided for in the provisional application incorporated by reference above, as well as in the patent application entitled "Material, Devices, and Methods for Resonant Ambient Thermal Energy Harvesting Using Thermal Diodes," of Michael S. Strano et al. and filed on an even date herewith, the disclosure of which is incorporated by reference herein in its entirety.

In some embodiments the thermal resonator 100 can include a monitor 118. The monitor 118 can include sensors (not shown) to track thermal temperature fluctuations, ambient temperature, and power output, among other data and information. The monitor 118 can be affixed to the thermal resonator 100 or placed external to the resonator to acquire measurements to which the thermal resonator is exposed. The monitor 118 can be positioned on the base portion 106, as shown, though, in some embodiments the monitor 118 can be coupled to the heat fin 108 or otherwise associated with the resonator 100 to allow it to gather data and information as desired. In some embodiments, the monitor 118 can be in the form of a data acquisition board. Some non-limiting examples of data acquisition boards can include a DrDAQ or a LabJack data acquisition board, or that is in electrical communication with the thermal resonator. The acquisition data board can be in communication with the thermal resonator 100 using one or more wires 120 to carry signals therebetween. Alternative measures can also be used for data transfer, including electrical, digital, optical, and wireless communications. Further, in some embodiments, microprocessors can be employed for data collection, the microprocessors being configured to receive the data from the data transfer, which can in turn be used to quantify thermal resonator performance, among other features. Based on the data received by the microprocessor, and/or used by the microprocessor to make determinations about the performance of the thermal resonator 100 (e.g., a quantified thermal resonator performance, as provided for herein or otherwise derivable from the present disclosures) and/or the surrounding environment, the microprocessor can help operate or otherwise be a part of a feedback loop. The feedback loop can use the determinations made by the microprocessor to alter one or more parameters of the device and/or the surrounding environment to achieve a desired result (e.g., improved performance, achieving a particular voltage output, etc.). Although a microprocessor is described as being part of a feedback loop, a person skilled in the art will recognize other systems and devices that can be incorporated into a feedback loop that can achieve the same purposes—that is, to utilize data to improve performance of the thermal resonator 100.

Figure 2:
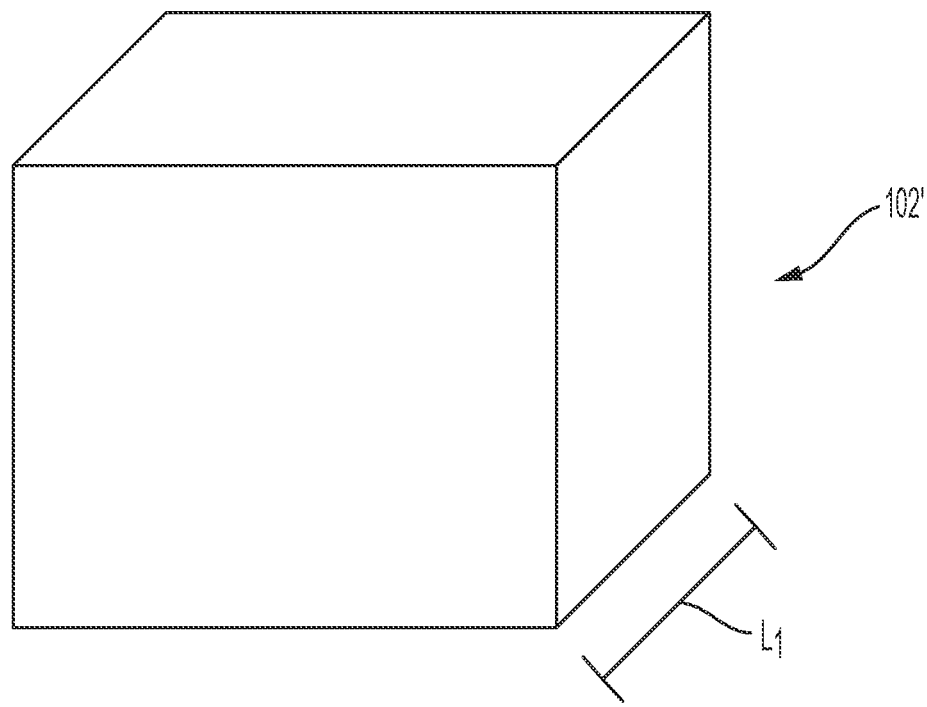
FIG. 2 is a schematic perspective view of a mass that can be incorporated into the thermal resonance device of FIG. 1A.

FIG. 2 provides for another exemplary embodiment of a thermal mass 102' that can be used with the thermal resonators described herein. The thermal mass 102' can include one or more dimensions that can be varied in size to optimize the power output of the thermal resonator 100 within which the mass is disposed. As shown, the mass 102' can include a rectangular prism having a varying dimension, e.g., length $L_1$. Varying the length $L_1$ can tune the mass with respect to its thermal diffusion time scale, as described below. It will be appreciated that the thermal mass 102' of FIG. 2 can be representative of either or both of the first and second thermal masses. The remaining dimensions of the mass can be on the scale of any unit of measure, e.g., millimeters, centimeters, meters, and so forth. In some embodiments, the thermal masses 102 can be sized such that the thermal resonator with which the masses are used is easily portable between multiple locations. In some embodiments, the width and the depth of the thermal mass 102 can also be varied when tuning the mass with respect to its thermal diffusion time scale. It will be appreciated that the shape of the thermal mass 102 is merely exemplary, and in some embodiments, the mass can be circular, cylindrical, pyramidal, or another shape configured to be disposed within, or otherwise a part of, the thermal resonator 100. Likewise, although FIG. 2 provides for a varying dimension, e.g., length $L_1$, a person skilled in the art will recognize that other dimensions can be varied in this embodiment and/or in any other embodiment provided for herein or otherwise derivable from the present disclosures.

Figure 3A:
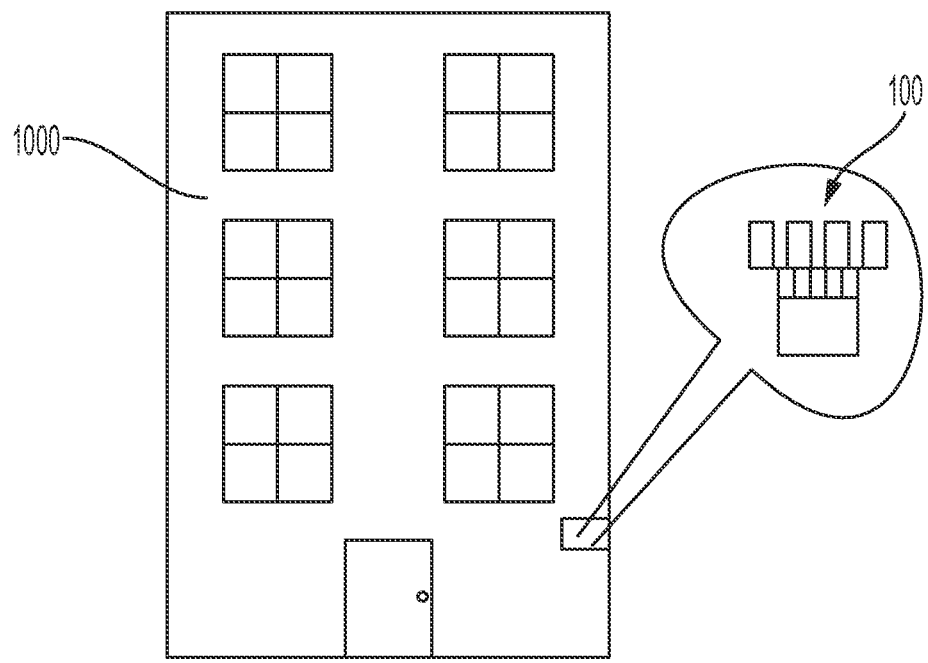
FIG. 3A is a schematic illustration of a building having the thermal resonance device of FIG. 1A associated therewith.
Figure 3B:
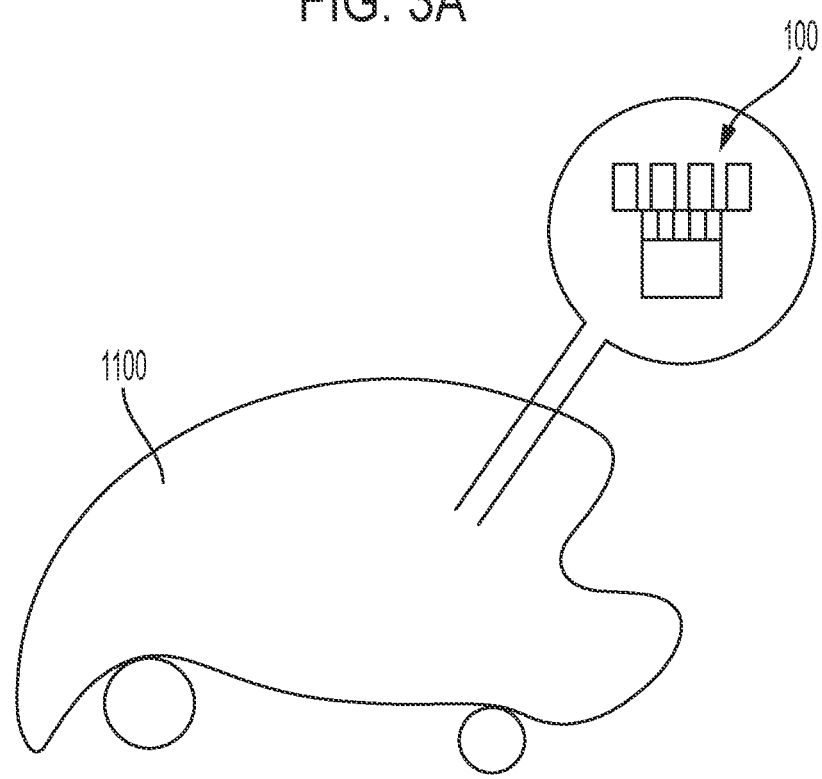
FIG. 3B is a schematic illustration of a vehicle having the thermal resonance device of FIG. 1A associated therewith.

In some embodiments, the thermal resonator 100 of FIGS. 1A-1B, as well as other thermal resonators provided for herein or otherwise derivable from the present disclosures, can be incorporated or placed in various structures to generate energy within the structures. As shown in FIGS. 3A-3B, the thermal resonator 100 can be incorporated into a brick of a building 1000 or under a hood of a vehicle 1100 to generate electricity. That electricity can be used to power components of the object with which the resonator 100 was incorporated, to power nearby objects, and/or can be stored for use at a later time and/or location. Thus, for the embodiment illustrated in FIG. 3A, the thermal resonator 100 can use the resulting power to operate lights, computers, and/or any other types of objects within, on, and/or near the building. The use can occur near instantaneously after the power has been generated, and/or at least some of the power can be stored for later use on site or elsewhere. Likewise, for the embodiment illustrated in FIG. 3B, the thermal resonator 100 can use the resulting power to operate various features of the vehicle, such as the radio, Bluetooth, lights, windows, and other powered features of the vehicle, and/or components associated therewith, such as one or more cellular telephones and/or GPS devices located within or on the vehicle. Similarly to the building, at least some of the power can be stored for later use with respect to the vehicle or elsewhere.

One skilled in the art will appreciate that the thermal resonator 100 can be added to a variety of structures. For example, in some embodiments the thermal resonator 100 can provide energy to outdoor structures, such as boats, bridges, benches, and street or sidewalk lights, as well as underground structures, such as pipes and tunnel boring machines. In the case of underground structures or underwater machinery, such as a glider or a submarine, it can be useful for the thermal resonator 100 to include a battery or a capacitor (not shown) for storing energy after conversion, although the incorporation of an energy storing component can be utilized in any configuration or set-up. The stored energy can then be utilized when the structure is underground, underwater, or such that it is otherwise not being exposed to ambient thermal fluctuations to generate energy. In embodiments in which the thermal resonator may be the only source of energy, the capacitor can store and release the energy to continue to power the structure during operation. In some embodiments, the thermal resonators can be added to structures exposed to harvest thermal fluctuations of large magnitudes, e.g., satellites and space stations. In some embodiments, the energy generated by the thermal resonator can be used to charge batteries.

Although discussed in the present disclosure with respect to a building and a vehicle, a person skilled in the art will recognize that the building and vehicle are by no means limiting of the types of objects and/or the type of environments with which the present disclosures related to thermal resonance devices and thermal effusivity can be utilized. As discussed above, a variety of time varying temperature baths exist at a variety of frequencies, allowing thermal resonators provided for herein, or otherwise derivable from the present disclosures, to be used in a variety of ways and in conjunction with a variety of structures. The thermal resonator 100, and other configurations provided for herein or otherwise derivable therefrom, can be added to any structure that allows for conversion of thermal energy to power to occur. By way of non-limiting examples, the thermal resonator 100 can be using in conjunction with: drones and other similar devices based on lapse rates during vertical movement to create aerial temperature fluctuations; buildings based on temperature fluctuations, such as at the top and bottom; objects disposed underwater (e.g., gliders), which can have underwater temperature fluctuations, and can be enhanced by spatial movement; vehicles and planes based on exhaust rate changes at different times, such as when idling, to create temperature fluctuations; objects in space (e.g., satellites), based on temperature fluctuations that occur when the objects do or do not face the sun); machinery in a manufacturing facility or other building, which can rely on temperature fluctuations generated by the machinery and can be used, for example in industrial monitoring; duty cycles of electronics, such as cellular telephones and computers, which can create device fluctuations based on their use throughout the day; revolving doors based on temperature fluctuations that occur as portions of the door are exposed to environments inside and outside a building; a solar panel or cell, in which a thermal resonator can be used to hold or otherwise support the solar panel or cell, and temperature fluctuations can occur between one end that is proximate to the panel or cell and a second end that is proximate or disposed in the ground; and a pocket of an article of clothing, based on personal temperature fluctuations that surround a person during daily activities. Further, as discussed in greater detail below, objects themselves can be part of a thermal resonator, for example, by serving as one of the thermal masses. The examples provided in this paragraph are just some of the many objects that themselves can serve as one of the thermal masses.

Figure 4:
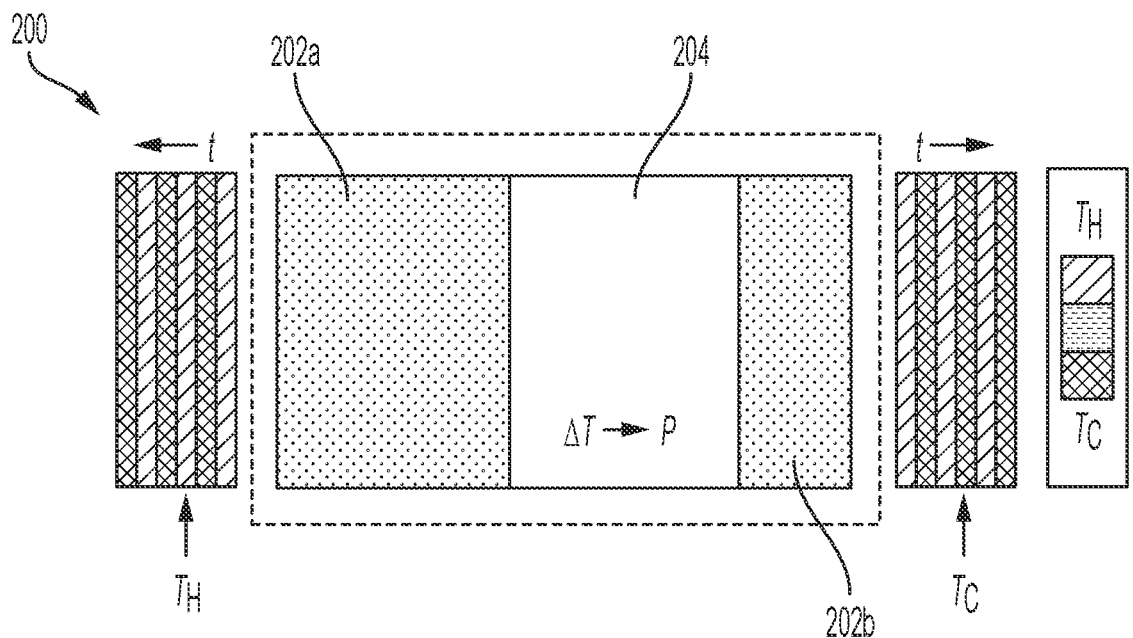
FIG. 4 is a schematic side view of another exemplary embodiment of a thermal resonance device.

FIG. 4 illustrates a general schematic of a thermal resonator 200 that can be used to generate electrical energy from thermal fluctuations with an accompanying ambient temperature profile. The thermal resonator 200 can include a plurality of thermal masses 202a, 202b and a heat engine 204, which can convert temperature fluctuations to a spatial temperature difference for power extraction via the heat engine. As shown, the heat engine 204 can be encased or otherwise disposed between the first thermal mass 202a and the second thermal mass 202b such that the heat engine 204 is in communication with each mass. In some embodiments the heat engine 204 can contact each of the first and second thermal masses 202a, 202b such that temperature fluctuations across each of the masses can be sent to the heat engine for conversion to power.

In the illustrated embodiment, the first mass 202a is larger in one or more of volume or surface area, or possesses a larger diffusion time scale than the second mass 202b. In such a configuration, the first mass 202a can be referred to as a dominant thermal mass. The dominant thermal mass can be larger than the second mass in one or more of length, width, depth, or any dimension recognized by a person of skill in the art, and/or possesses the larger diffusion time scale. In some embodiments, the second mass can be larger than the first mass, which can result in the second mass being the dominant thermal mass. One skilled in the art will appreciate that masses having larger diffusion time scales are typically geometrically larger, though, in some embodiments, geometrically smaller masses can have larger diffusion time scales based on composition, density, and other factors recognizable by a person skilled in the art. Each mass, when exposed to a temperature that can oscillate in time between hot (red; $T_H=T_0+T_A$) and cold (blue; $T_C=T_0-T_A$), as shown, can convert or transform the temperature fluctuations into a spatial temperature difference, $\Delta T(t)$, across the thermal resonator. The spatial temperature difference can then be converted to usable work, e.g., power (P), by the generic heat engine, as described further below.

Each mass can be made from an ultra-high effusivity material configured to optimize the transfer of thermal energy. Ultra-high effusivity materials can include materials having internal structures in which particles are connected to one another such that thermal energy is transferred through the material with minimal escape through the spaces between the grains of the material. For example, phase-change materials having high thermal effusivities, such as OD and metal foams. Exemplary metal foams include copper (Cu) (approximately 95% porosity, nominal cell size of approximately 580 μm) or nickel (Ni) (approximately 95% porosity, average pore diameter of approximately 250 μm). The PCM composites, or other ultra-high thermal effusivity materials, can be prepared by the incorporation of conformal, chemical-vapor-deposited (CVD) multi-layer graphene into PCM composites such that the resulting composites have an ultra-high effusivity (e.g., Cu/G/OD and Ni/G/OD). The metal foams can serve as a highly thermally conducting and porous matrix, while the OD bolsters the thermal capacitance through the latent heat of its phase-change. OD can be chosen as the phase-change material because its phase transition temperature (approximately 27.7° C.) makes it amenable to ambient energy harvesting. The incorporation of carbon nanomaterials, such as graphene and carbon nanotubes, can enhance the thermal conductivity of composite systems while negligibly affecting the thermal capacitance of the system because of the low volume fractions needed to affect thermal conduction.

Materials such as graphene, OD, copper, and nickel represent non-limiting examples of materials that can be used to create ultra-high effusivity material in accordance with the teachings herein. A person skilled in the art, in view of the present disclosures, will understand other materials that can be used to create ultra-high effusivity materials, including, but not limited to: aluminum, iron, and/or titanium combined with phase-change materials such as water, OD, hexadecane, and/or eicosane, or other combinations of highly thermally conducting materials with phase-change materials.

The thermal masses 202a, 202b can be manufactured in a variety of ways. For example, in some embodiments multilayer graphene can be grown on Cu foam and Ni foams, which can then be vacuum-impregnated with molten OD. After infusion with OD, and being coated with the multilayer graphene, the ultra-high effusivity materials can fill the pores between the grain boundaries of the metal foams to create connectivity between grains, thereby improving the heat transfer across the grain boundaries of the metal foams, as well as augmenting interfacial heat transfer between the OD and the Ni foams. The resulting composite PCMs can have higher thermal conductivity and thermal effusivity as compared to their PCM counterparts, which supports complete OD impregnation of the metal foams. Additional embodiments for fabrication of ultra-high effusivity materials can be found in the methods section below. A person skilled in the art, in view of the present disclosures, will understand other manufacturing techniques that can be used to create thermal masses, diodes, etc. that have high or ultra-high thermal effusivity, and can apply such techniques to create thermal resonators like those provided for herein.

Tuning and effusivity of materials that make up the masses can yield optimal power generation. For example, tuning the thermal masses to an optimal thermal diffusion time scale for the linear thermal mass in relation to the frequency of temperature oscillations can greatly increase generation of power from thermal fluctuations over large ranges of frequencies. In some embodiments the addition of an ideally-tuned standard thermal mass (e.g., Teflon) can improve the average power by a factor of approximately 200 as compared with a bare thermoelectric. In embodiments utilizing the PCM composites discussed above (e.g., Cu/G/OD and Ni/G/OD, the thermal effusivity further boosts the average power by a factor of approximately 800 as compared with the bare thermoelectric.

One skilled in the art will appreciate that although thermal resonators having masses made of ultra-high effusivity composites are predominantly described herein, masses made of high effusivity materials can also be used in thermal resonators with the understanding that these masses likely yield a lower power output when compared to those that use ultra-high effusivity composites. For example, the enhancement in power output of the ultra-high effusivity composites as compared to the PCMs, e.g., OD, nickel, and copper, is substantially proportional to the thermal effusivity of the relative materials—a factor of approximately 2.6. A person skilled in the art will appreciate that the factor can be lower for some ultra-high effusivity composites in cases in which layers of the composite are stacked relative to one another due to interfacial thermal resistances between layers of the ultra-high effusivity composite. For example, in some embodiments a ratio of the power output of the ultra-high effusivity composites as compared to the PCMs can be about 2.4, about 2.2, about 2.0, about 1.8, or about 1.6 due, at least in part, to interfacial thermal resistances for composites having a plurality of layers stacked relative to one another. In some embodiments, a maximum average power of approximately 786 μW can be observed for thermal resonators having ultra-high effusivity materials, e.g., the Cu/G/OD resonator, which outperforms common (e.g., 250 μW) and state-of-the-art (e.g., 490 μW) pyroelectrics.

Figure 5:
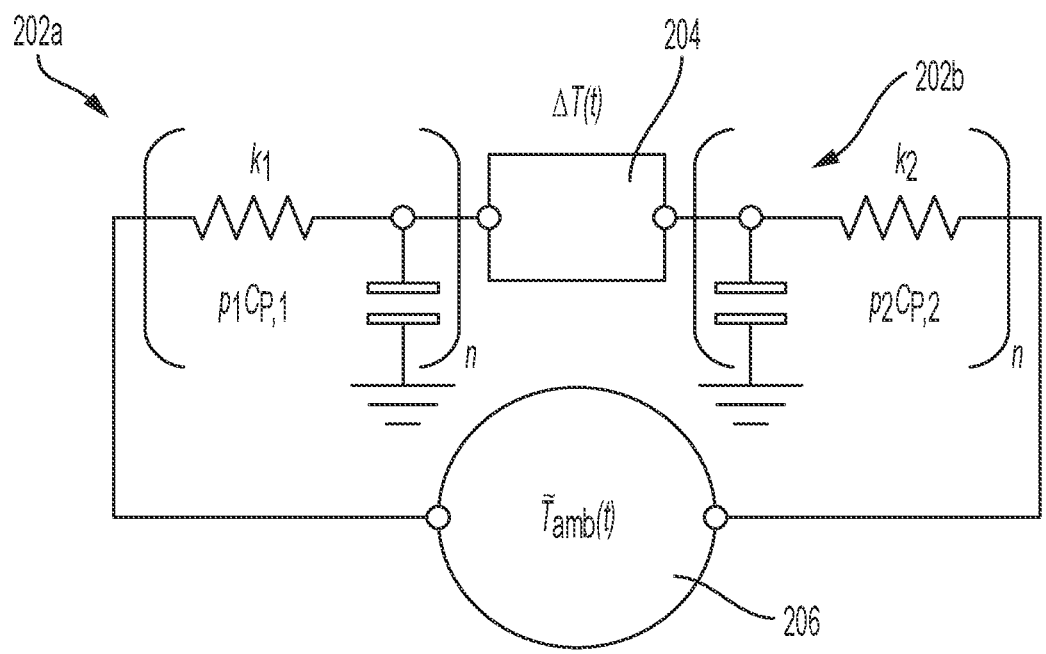
FIG. 5 is a pictorial representation of a thermal circuit demonstrating the operation and modeling details of the thermal resonance device of FIG. 4.

FIG. 5 illustrates a thermal circuit that can demonstrate the operation and modeling details of the thermal resonator 200. As shown, the first and second thermal masses 202a, 202b, which encase or are otherwise disposed on either side of the heat engine 204, can be connected by a time varying source 206. The first and second thermal masses 202a, 202b can be expressed in terms of their thermal resistance parameters ($k_1$, $k_2$, $L_1$, $L_2$) and thermal capacitor parameters ($\rho_1 C_{p,1}$, $\rho_2 C_{p,2}$). Mathematically, the thermal effusivity (e) is related to the product of the material's thermal conductivity (k) and the material's volumetric heat capacity (C) as shown in Eq. (1):

$$e = \sqrt{kC} = \sqrt{kpC_p} \qquad (1)$$

where $\rho$ is the material's density and $C_p$ is the material's specific heat.

The thermal resonator 200 having first and second thermal masses 202a, 202b being made from one or more of the ultra-high effusivity materials discussed above can be disposed at a certain ambient temperature, or connected to the input time varying source, which includes temperature fluctuations that can be converted to electrical energy. The ambient temperature varying in time can be depicted by the time varying source, which can be modeled as:

$$\tilde{T}_{amb}(t) = T_0 + T_A \sin(\omega t) \qquad (2)$$

where $\tilde{T}_{amb}$ is the ambient temperature, $T_0$ is the median ambient temperature, $T_A$ is the amplitude for ambient thermal fluctuations, $\omega$ is the fundamental angular frequency of temperature oscillations, and t is time.

Temperature fluctuations supplied by the time varying source can be transformed into a spatial temperature difference in a variety of ways. Some non-limiting examples of time varying sources can include the diurnal cycle, the heat duty cycle, temperatures experienced by a glider, plane, or drone, as discussed above, and other sources either provided for herein or otherwise known to those skilled in the art in view of the present disclosures. For example, as shown in FIG. 5, a thermoelectric device where a temperature difference, $\Delta T(t)$, approximately yields an output open circuit voltage, $V = \Gamma_S \Delta T(t)$, and power, as shown in Eq. (3):

$$P = \frac{(\Gamma_S \Delta T(t))^2}{R_{\textit{eff}}} \qquad (3)$$

where P is the power, $\Gamma_S$ is the Seebeck coefficient, and $R_{\textit{eff}}$ is an effective resistance that accounts for thermal and electrical resistances in the system. In the absence of additional thermal circuit elements, the power generated by the circuit is zero for all time. However, as in the case of the circuit in FIG. 5, the heat engine is encased between the first and second thermal masses 202a, 202b, which have constant thermal conductivities ($k_1$, $k_2$). Additionally, the thermal masses have thermal capacitances ($\rho_1 C_{p,1}$, $\rho_2 C_{p,2}$) which are also independent of temperature. The resistive and capacitive elements of the thermal masses are differential in size ($n \rightarrow \infty$) and form a finite transmission line. These linear thermal masses can be specifically-paired to maximize the spatial and temporal temperature gradient existing across the heat engine such that persistent and continuous power can be harvested according to Eq. (3) from the ambient temperature fluctuations. In some embodiments, the transformation can occur by tuning the internal thermal resistance parameters ($k_1$, $k_2$, $L_1$, $L_2$) and thermal capacitor parameters ($\rho_1 C_{p,1}$, $\rho_2 C_{p,2}$), as described further below.

It will be appreciated that ambient temperature fluctuations differ from temperature gradients, as discussed above with respect to thermoelectrics. For example, temperature fluctuations can oscillate in time to create a spatial temperature difference, $\Delta T(t)$ whereas a thermal gradient can be a change in temperature over a distance, e.g., a length of the thermoelectric, as shown above in FIG. 4. That is, temperature fluctuations can occur at a particular point in space over changes in time, while temperature gradients can be changes in space at a particular point in time. Detecting temperature fluctuations in the ambient environment and converting these fluctuations to a static temperature distribution across the device, in which the first mass is hot or warm and the second mass, on an opposite side of the device, is cold, can present difficulties in trying to efficiently generate energy. Thermal fluctuations, on the other hand, are transient, but are otherwise spatially uniform around the device, which allows for capture and conversion to electrical energy.

Figure 6:
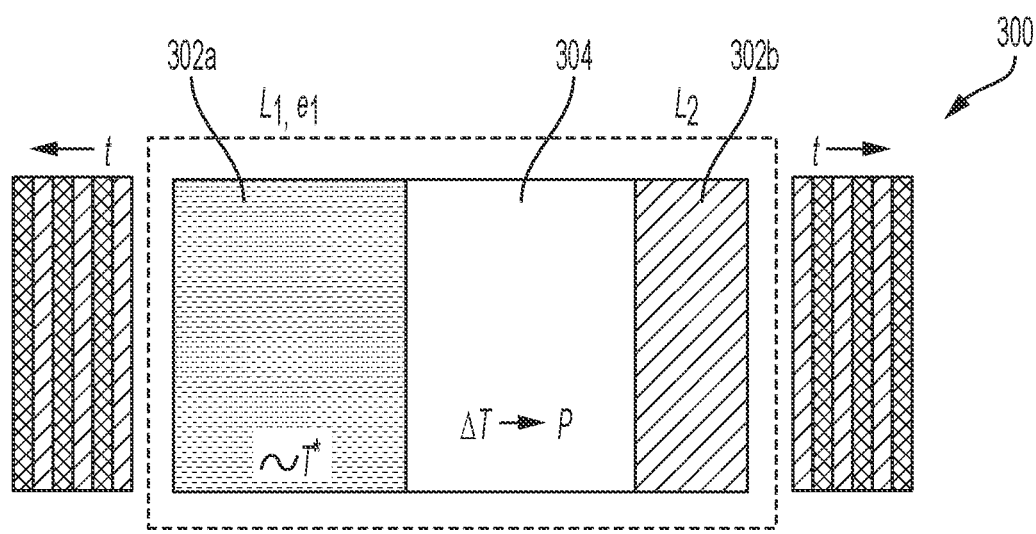
FIG. 6 is a schematic side view of still another exemplary embodiment of a thermal resonance device, the device having a thermoelectric disposed therein as a heat engine.

FIG. 6 illustrates an alternate embodiment of a thermal resonator 300 in which maximizing the thermal effusivity of the dominant thermal mass can optimize the power output. The device 300 includes first and second masses 302a, 302b, which are separated by a thermoelectric 304, rather than a heat engine. More generally, both heat engines and thermoelectrics as provided for herein or otherwise understood by those skilled in the art can be referred to as energy conversion components, with thermoelectrics having lower conversion efficiencies than larger heat engines, while being compact, portable, and sufficiently powerful to power a range of small devices, e.g., sensors. For example, as shown in FIG. 6, the dominant thermal mass 302a can be tuned to a temperature oscillation frequency to optimize the power harvesting capabilities of the thermal resonance device 300 to optimize the power output generated by the dominant thermal mass, and therefore the thermal resonator 300, while the second mass 302b can have negligible or low thermal resistance. A person skilled in the art will recognize that because thermal resonators can operate in a dynamic temperature environment, a PCM having a transition temperature that is in proximity to a median temperature of oscillations can be used to maximize or enhance the thermal effusivity. When seeking to achieve the enhanced thermal effusivity, effective thermal effusivity, $e_{\textit{eff}}$, should be used in lieu of Equation (1) presented above:

$$e_{\textit{eff}} = \sqrt{k\rho h} \qquad (4)$$

where h represents the latent heat per unit mass and replaces the sensible heat storage, e.g., the material's specific heat or heat capacity ($C_p$). In such embodiments, where unequal masses are separated by a thermoelectric, the second mass 302b can rapidly respond to a temperature of the ambient environment and equilibrate to adopt a temperature thereof, e.g., either hot, $T_H$, or cold, $T_C$, due to its smaller size. The dominant thermal mass 302a, on the other hand, due to its larger size, experiences a delay in reaching equilibrium, and does not rapidly respond to the environment. The dominant thermal mass 302a can exist mainly at the phase transition temperature ($\sim T^*$) near the median temperature of oscillations of the high thermal effusivity PCM. Incorporation of PCMs in proximity to their phase transition temperatures can result in an enhancement of approximately an order-of-magnitude in energy storage per unit volume in comparison to sensible heat storage that existed prior to the present disclosures. The size of the dominant mass 302a within the thermal resonator 300 can be chosen so as to enhance the thermal effusivity of the thermal resonator 300, and the two thermal masses 302a, 302b.

As discussed above, each of the first and second thermal masses 302a, 302b generate a temperature difference under fluctuating temperatures, and a thermoelectric device 304 situated between two such thermal masses generates electrical output according to Equation (3). To effectively harvest thermal energy from ambient temperature fluctuations, the thermal masses can be tuned, in terms of thermal resistances and capacitances, to the temperature oscillation frequency such that the power is optimized. A performance factor (Q) can be analytically derived for each thermal mass, which quantifies the time average power output ($P_{avg}$) of a certain thermal resonator design relative to the maximum power ($P_{max}$) attainable given the amplitude of temperature fluctuations:

$$Q = \frac{P_{avg}}{P_{max}} = \frac{\Delta T_{avg}^2}{4T_A^2} = \frac{1}{8}\left(\text{Re}\left[\text{sech}\left(\sqrt{iv}\right)\right] - \text{Re}\left[\text{sech}\left(\sqrt{Riv}\right)\right]\right)^2 \quad (5)$$

where:

$$v = \omega\frac{L_1^2}{\alpha_1}, \; R = \left(\frac{\alpha_1}{\alpha_2}\right)\left(\frac{L_2^2}{L_1^2}\right) \quad (6)$$

and where $T_A$ and $\omega$ are as defined above, $T_{avg}$ is the average temperature difference, $\alpha_j$ is the thermal diffusivity of thermal mass j, v is the dimensionless temperature oscillation frequency, and R is a ratio of thermal diffusion time scales. Equation (5) can be used in some embodiments, to determine a design for a power-optimized thermal resonator, in terms of length scales, for a given temperature fluctuation frequency and material for the dominant thermal mass.

In the case of unequal masses, based on the choice of terming the ultra-high thermal effusivity material as the first thermal mass 302a and the low thermal resistance material as the second thermal mass 302b, as well as non-dimensionalizing the temperature oscillation frequency ($\omega$) by the first thermal mass 302a, an ideal dimensionless temperature oscillation frequency ($v_{id}$) at which the performance factor is optimized. Solving for this frequency and the maximum performance factor numerically after simplification of Eq. (5) in the limit R=0, the performance factor becomes:

$$Q = \frac{1}{8}(\text{Re}[\text{sech}(\sqrt{iv})]-1)^2 \quad (7)$$

The maximum performance factor ($Q_{max}$=0.16), which can occur at the ideal dimensionless temperature oscillation frequency ($v_{id}$), indicates that, in some embodiments, approximately 16% of the maximum attainable power can be harvested with an optimized design. Furthermore, the ideal dimensionless temperature oscillation frequency for a given temperature oscillation frequency can show there exists an ideal thermal diffusion time scale that can be tuned for the dominant thermal mass. Tuning the thermal diffusion time scale can include regulating the values for the geometry, e.g., length, and/or thermal effusivity of the dominant mass according to the equations described above such that a spatial temperature difference exists across the heat engine for power extraction to optimize the power output. One skilled in the art will appreciate that to optimize the power output of the thermal resonator, a material having an ultra-high thermal effusivity should be employed as the thermal mass with the larger diffusion time scale. In some embodiments, the masses in the thermal resonator can be made from materials that do not have a high thermal effusivity. In such embodiments, the device can produce a dual polarity voltage output that produces a lower diffusion time scale that is less efficient in translating temperature fluctuations into a spatial temperature difference that can be converted to power. As disclosed herein, by maximizing thermal effusivity, for instance by using ultra-high thermal effusivity materials, power output can also be maximized.

Figure 7:
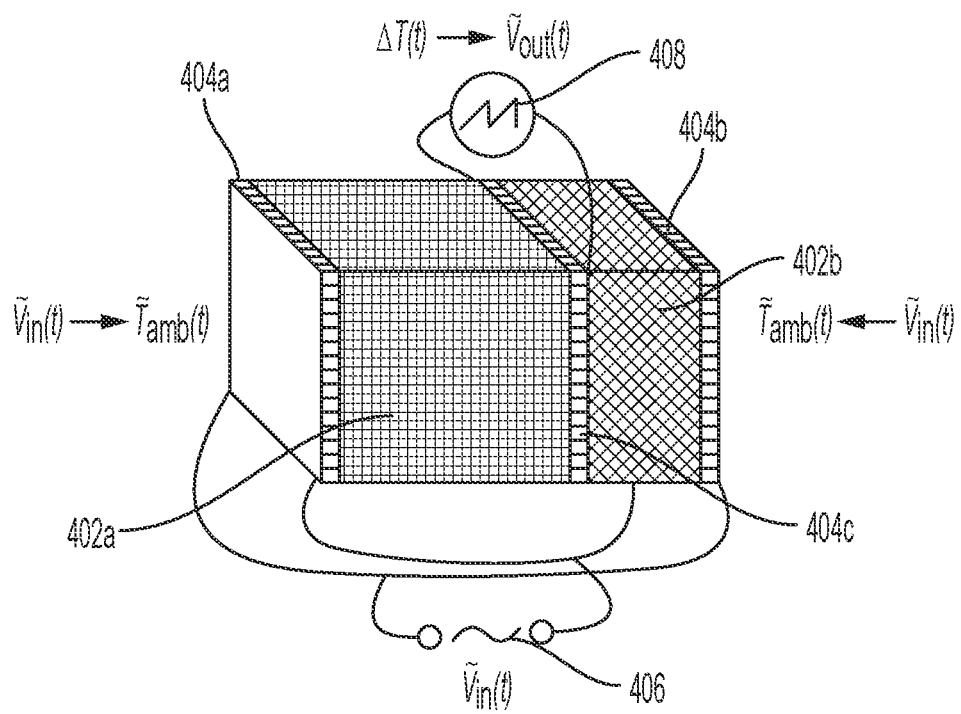
FIG. 7 is a schematic perspective view of one exemplary embodiment of an open-circuit resonance device configuration that is configured to measure open circuit voltage output and performance of a thermal resonance device.

FIG. 7 illustrates an exemplary embodiment of a thermal resonance device or resonator 400 that can verify the prediction of ideal frequency discussed above to investigate the relationship, for example, between the thermal diffusion time scale of the dominant thermal mass and the ideal temperature oscillation frequency ($v_{id}$). The thermal resonator 400 can measure the open circuit voltage output and performance of a thermal resonator that is characterized by a dual polarity temperature difference across the central heat engine in response to a sinusoidal temperature fluctuation input.

The thermal resonator 400 can include a pair of thermoelectrics 404a, 404b disposed at opposite ends of first and second thermal masses 402a, 402b, connected to a potentiostat 406 that can operate in a continuous, oscillatory manner. As shown, the thermoelectrics 404a, 404b can be positioned on opposite sides of the thermal resonator 400 such that each thermoelectric 404 contacts a surface of the first and second thermal masses 402a, 402b, respectively. The thermoelectrics 404a, 404b can supply identical, oscillating temperature boundary conditions to either side of the thermal resonator 400 to create a potential difference therebetween that results in a dual polarity voltage output. The thermoelectrics 404a, 404b can be connected in parallel, though, in some embodiments the thermoelectrics can be connected in series.

The thermal resonator 400 can further include a third thermoelectric 404c positioned between the thermal masses 402a, 402b, as shown. The third thermoelectric 404c can act as a heat engine for the thermal resonator 400 to convert the thermal fluctuations to electrical energy. As shown, an oscilloscope 408 configured to measure voltage can be connected to the third thermoelectric 404c to measure the voltage output on the thermal resonator 400. Other components that can be used in lieu of, or in conjunction with, the oscilloscope 408 include a voltage detector, a DrDAQ data acquisition board, and/or other devices configured to measure voltage.

An ideal dimensional frequency for operation of the thermal resonator 400 can be inversely related to the time scale of thermal diffusion for the first thermal mass 402a. In some embodiments, the average power output, $P_{avg}$, can be proportional to the thermal effusivity of the dominant thermal mass 402a for a constant value of Q. This can occur when v»1 such that Q=⅛, or it can occur when the thermal diffusion time scale, which is related to length and thermal effusivity as discussed above, is identical for the dominant thermal masses. It should also be noted that the average power density is often closely related to the magnitudes of the efficiency of the thermoelectric, the amplitude of temperature fluctuations, and/or the dominant frequency of temperature fluctuations.

To optimize the power output of a thermal resonator, one or more features of the thermal resonator 400 can be varied. For example, the thermal resonator 400 can be used by varying the material and/or the dimensions of the dominant thermal mass 402a, e.g., length, over a broad range of temperature oscillation frequencies. One or more of the thermal masses 402a, 402b can be tuned to the frequency of temperature oscillations by changing their respective sizes. In the embodiment of FIG. 7, the dominant thermal mass 402a in the thermal resonator 400 can include a width and height of approximately 1.5 cm by approximately 1.5 cm and vary in thickness, or length, while the invariant, low thermal resistance mass 402b can include a width and height of approximately 1.5 cm by approximately 1.5 cm and can be approximately 0.5 cm and can be made of steel, among other materials. In some exemplary embodiments, a length of the dominant thermal mass 402a can be approximately 2.5 cm, 7.5 cm, or 15 cm and can made of Teflon, among other materials, and a length of the invariant, low thermal resistance mass 402b can be approximately 2.5 cm in length, approximately 14 cm in width and in height, and can be made of aluminum, among other materials. One skilled in the art will appreciate that the dimensions of each of the first and second thermal masses 402a, 402b can be increased and/or decreased based, at least in part, on the temperature oscillation frequency of the thermal resonator 400. Maximizing the thermal effusivity of the dominant thermal mass 402a can optimize the power output. When properly tuned, the temperature oscillates around the phase transition temperature of the high effusivity materials, which can enable activation of the enhanced, effective thermal effusivity definition discussed in Equation (4) above.

Earlier it was described that the thermal resonators provided for in the present disclosure can be associated with various objects to provide energy for use by the same and/or to store energy for subsequent use. The present disclosures also provide for the use of an object (e.g., a building, vehicle, boat, bench, chair, or other structure) as one of the thermal masses of a thermal resonator. For example, a second mass and one or more modules, e.g., thermoelectric modules, can be attached to an existing mass, e.g., a chair, to capture ambient thermal fluctuations and convert the fluctuations to energy. In such an instance, the existing mass can become the dominant thermal mass, although in other instances the existing mass can be the non-dominant thermal mass. One skilled in the art will appreciate that larger masses, such as those provided by many existing objects, have greater surface areas and can thus capture larger ambient thermal fluctuations. The resulting thermal resonator can be tuned to the dominant frequency of the temperature fluctuations to capture maximum amounts of thermal fluctuations to yield larger power outputs. The power that is output can be used to power components of the existing object itself, other aspects associated with the object, and/or to store energy for future use by the object, aspects associated with the object, or other objects or the like. It will be appreciated that such thermal resonators can generate energy according to the unequal mass principles discussed above.

By way of non-limiting example, in an instance in which a building serves as one of the masses of thermal resonator, the other components of the thermal resonator (e.g., the other mass and the heat engine or thermoelectric) can be coupled to, or otherwise associated with, the building to allow the components to operate as a thermal resonator. The power that results can be used to power portions of the building, such as any part of the electrical grid of the building (e.g., outlets, lights, computers, etc.), objects associated with the building (nearby parking garages, bicycle share stations, batteries, electric car charging stations, etc.), objects that typically require embedded energy sources (e.g., structural elements or foundations of bridges and/or buildings used for structural integrity monitoring), or other objects entirely (fed back into a local power grid, batteries, etc.). Alternatively, or additionally, the power that results can be stored for future use, whether on site (e.g., the building, objects associated with the building, etc.) or remote (e.g., moved to another location where power is needed for whatever reason, batteries, etc.). Although the example just discussed relates to a building, a person skilled in the art, in view of the present disclosures, will recognize any number of objects that can be used instead of a building as a thermal mass of a thermal resonance device to achieve similar results, including but not limited to those provided above (e.g., drones and other similar devices; objects disposed underwater, such as gliders; vehicles; planes; objects in space, such as satellites; machinery; electronic devices, such as cellular telephones and computers; revolving doors; solar panels or cells; an article of clothing; etc.).

In some embodiments, the thermal resonator using an existing mass can be used as an additional energy source to an already existing object that captures and converts energies. For example, an object or base of a solar panel or cell can be turned into a thermal resonator. The object or base can be, for example, a pole or other structure that supports the solar panel or cell to allow the solar panel or cell to be exposed to the sun. One end of the pole can be proximate to the solar panel or cell, and the other end of the pole can be proximate, or even disposed in, the ground. Such a configuration can generate energy that does not compete with energy generated by the solar panel or cell, but rather, can be an additional energy that is generated to supplement that of the solar panel or cell.

As described above, the thermal resonators provided for in the present disclosure can benefit from the use of ultra-high thermal effusivity materials. Two non-limiting exemplary configurations of such materials include Ni/OD and Ni/G/OD. These materials can be fabricated, for instance, by respectively impregnating two foams with octadecane (OD): pristine Ni foam substrate (porosity approximately 95%, pores per inch (PPI) approximately in the range of about 80 to about 110, and thickness approximately 1.6 mm, as manufactured by MTI Corporation, Richmond, Calif.) and Ni foam (porosity approximately 95%, PPI approximately in the range of about 80 to about 110, and thickness approximately 1.6 mm, as manufactured by MTI Corporation) with CVD-grown multi-layer graphene. The result is a formation of ultra-high thermal effusivity materials referred to as Ni/OD and Ni/G/OD, respectively. A person skilled in the art will recognize these materials can be created separately, as the description of forming them together was made for brevity.

Multi-layer graphene can be grown upon the Ni foam substrate, for example, in a quartz tube. In one non-limiting instance, the tube can have an outer diameter of about 25 mm and an inner diameter of about 22 mm. The Ni foams can be exposed to Ar (about 300 sccm) for about 15 minutes at ambient conditions. The Ni foams can then exposed to Ar (about 300 sccm) and $H_2$ (about 100 sccm) for about 20 minutes at ambient conditions. The Ni foams can then be heated to about 1000° C. and annealed for about 30 minutes in a tube furnace (e.g., a Lindberg Blue M furnace from Thermo Fisher Scientific, Waltham, Mass.) with Ar (about 300 sccm) and $H_2$ (about 100 sccm) exposure. $CH_4$ can be introduced (about 10 sccm) for about 5 minutes at about 1000° C. as the carbon source for graphene growth. The sample can then be quickly cooled to room temperature at about 100° C./min under Ar exposure (about 300 sccm). All steps can be performed at about 760 Torr. The samples can be vacuum impregnated when exposed to molten OD (e.g., from Sigma-Aldrich, St. Louis, Mo.) at approximately 40° C. in a vacuum oven for about two hours. Following impregnation, the samples can be suspended and allowed to dry at ambient conditions. In some instances for constructing thermal resonators, passive impregnation can be used to form Ni/G/OD.

Two additional non-limiting exemplary configurations of ultra-high thermal effusivity materials that can be used in conjunction with thermal resonators provided for herein or otherwise derivable from the present disclosures include Cu/OD and Cu/G/OD. These materials can be fabricated, for instance, by respectively impregnating two foams with OD:

pristine Cu foam substrate (porosity approximately 95%, approximately 580 μm nominal cell size, and thickness approximately 1.9 mm, as manufactured by Alantum GmbH, Seongnam-City, Gyonggi-Do, Korea) and Cu foam (porosity approximately 95%, approximately 580 μm nominal cell size, and thickness approximately 1.9 mm, as manufactured by Alantum) with CVD-grown multi-layer graphene. The result is a formation of ultra-high thermal effusivity materials referred to as Cu/OD and Cu/G/OD, respectively.

Multi-layer graphene can be grown upon the Cu foam substrate, for example, in a quartz tube. In one non-limiting instance, the tube can have an outer diameter of about 25 mm and an inner diameter of about 22 mm. The Cu foams can be exposed to Ar (about 300 sccm) for about 20 minutes at ambient conditions. The Cu foams can then be heated to about 920° C. over the course of about 30 minutes in a tube furnace (e.g., a Lindberg Blue M furnace from Thermo Fisher Scientific) with Ar (about 300 sccm) exposure. $CH_4$ (about 10 sccm) and $H_2$ (about 30 sccm) can be introduced for about 90 minutes at about 920° C. The sample can then be quickly cooled to room temperature at about 100° C./min under Ar (about 300 sccm) and $H_2$ (about 30 sccm) exposure. All steps can be performed at about 760 Torr. The samples can be vacuum impregnated when exposed to molten OD (e.g., from Sigma-Aldrich) at approximately 40° C. in a vacuum oven for about two hours. Following impregnation, the samples can be suspended and allowed to dry at ambient conditions. In some instances for constructing thermal resonators, passive impregnation can be used to form Cu/G/OD.

A person skilled in the art, in view of the present disclosures, will recognize that many of the parameters provided for above to create the ultra-high thermal effusivity materials can be varied and can depend, at least in part, on the tools available, the desired structure of the materials, and the other objects to be used in conjunction with the resulting thermal resonator. The disclosures of various properties are in no way limiting to how ultra-high thermal effusivity materials can be made and used in conjunction with the present disclosures of thermal resonators.

Although it has been indicated before, it bears repeating that the present disclosures allow for a plethora of different thermal resonators having different thermal masses to be created, with the backbone being that pre-existing components can be individually tailored for various uses. Accordingly, the illustrated masses and their commensurate shapes and/or length, materials, and thermal resonator concepts, as well as the way they are combined to create different methods, uses, etc. are in no way limiting. A person skilled in the art, in view of the present disclosures, will understand how to apply the teachings of one embodiment to other embodiments either explicitly or implicitly provided for in the present disclosures. Further, a person skilled in the art will appreciate further features and advantages of the invention based on the above-described embodiments. Accordingly, the invention is not to be limited by what has been particularly shown and described, except as indicated by the appended claims. Additional details related to the present disclosure can be found in an article entitled "Ultra-high thermal effusivity materials for resonant ambient thermal energy harvesting," written by Anton L. Cottrill et al., and published by Nature Communications on Feb. 14, 2018, which can be found at https://www.nature.com/articles/s41467-018-03029-x, as well as other information contained at that link, such as the "Supplementary Information," which can be found directly at https://static content.springer.com/esm/art%3A10.1038%2Fs41467-018-03029-x/MediaObjects/41467 2018 3029 MOESM1 ESM.pdf as of the date the present application was filed. All publications and references cited herein, including the aforementioned article and related materials, and previously referenced patent applications, are expressly incorporated herein by reference in their entireties.

What is claimed is:

1. An energy harvesting system, comprising:
   a first thermal mass having a first thermal diffusion time scale;
   a second thermal mass having a second thermal diffusion time scale;
   a heat engine disposed between the first thermal mass and the second thermal mass and configured to translate a spatial temperature difference between the first thermal mass and the second thermal mass into power;
   a feedback loop that includes a microprocessor, the feedback loop being configured to tune at least one of the first thermal mass or the second thermal mass based on the respective first thermal diffusion time scale or the second thermal diffusion time scale such that the spatial temperature difference exists across the heat engine for power extraction,
   wherein tuning based on at least one of the first thermal diffusion time scale or the second thermal diffusion time scale further comprises the system being configured to regulate a value of a geometry of at least one of the first thermal mass or the second thermal mass, or regulate a value of a thermal effusivity of at least one of the first thermal mass or the second thermal mass to create the spiral temperature difference between the first thermal mass and the second thermal mass.

2. The energy harvesting system of claim 1, wherein at least one of the first thermal mass or the second thermal mass comprises one or more ultra-high thermal effusivity materials.

3. The energy harvesting system of claim 2, wherein the one or more ultra-high thermal effusivity materials are disposed within a housing of the at least one of the first thermal mass or the second thermal mass such that the one or more ultra-high thermal effusivity materials substantially fills a volume of the housing.

4. The energy harvesting system of claim 2, wherein the one or more ultra-high thermal effusivity materials comprise at least one of a Copper/Graphene/Octadecane phase-change material composite or a Nickel/Graphene/Octadecane phase-change material composite.

5. The energy harvesting system claim 1, wherein each of the first diffusion time scale and the second diffusion time scale is configured to be controlled by a thermal effusivity of the respective first thermal mass and the second thermal mass, with the thermal effusivity being controlled by each of a thermal conductivity of the respective first thermal mass and second thermal mass, a density of the respective first thermal mass and second thermal mass, and a specific heat capacity of the respective first thermal mass and the second thermal mass.

6. The energy harvesting system of claim 1, wherein each of the first diffusion time scale and the second diffusion time scale is configured to be controlled by a thermal effusivity of the respective first thermal mass and the second thermal mass, with the thermal effusivity being controlled by each of a thermal conductivity of the respective first thermal mass and second thermal mass, a density of the respective first thermal mass and second thermal mass, and a latent heat of the respective first thermal mass and the second thermal mass.

7. The energy harvesting system of claim 1, wherein the heat engine is configured to be coupled to the second thermal mass in which the second thermal mass comprises a pre-existing object.

8. The energy harvesting system of claim 1, wherein the at least one of the first thermal mass or the second thermal mass is configured to be tuned based or: (1) the respective first thermal diffusion time scale or the second thermal diffusion time scale: (2) at least one of a size of the at least one of the first thermal mass or the second thermal mass: or (3) a thermal effusivity of the at least one of the first thermal mass or the second thermal mass.

9. The energy harvesting system of claim 1, wherein the at least one of the first thermal mass or the second thermal mass is configured to be tuned based on: (1) the respective first thermal diffusion time scale or the second thermal diffusion time scale: or (2) a temperature oscillation frequency of the at least one of the first thermal mass or the second thermal mass such that the power generated by the heat engine is optimized.

10. The energy harvesting system of claim 1, further comprising:

a monitor in communication with the energy harvesting system and configured to acquire data related to at least one of the energy harvesting system or an environment surrounding the energy harvesting system; and the microprocessor configured to adjust one or more parameters of at least one of the energy harvesting system or the environment surrounding the energy harvesting system in response to the data acquired by the monitor.

11. The energy harvesting system of claim 1, wherein the system is configured to produce a dual polarity voltage output.

12. The system of claim 1, wherein the at least one of the first and second thermal masses is configured to be tuned to a dominant frequency of a temperature waveform to capture temperature fluctuations that yield power outputs.

13. The system of claim 1, wherein the feedback loop is further configured to adjust at least one of the first thermal mass or the second thermal mass to an ideal temperature oscillation frequency to optimize a value of the performance factor.

* * * * *